(12) United States Patent
Yamazaki et al.

(10) Patent No.: US 8,830,217 B2
(45) Date of Patent: Sep. 9, 2014

(54) ADHESION TYPE AREA SENSOR AND DISPLAY DEVICE HAVING ADHESION TYPE AREA SENSOR

(71) Applicant: Semiconductor Energy Laboratory Co., Ltd., Atsugi (JP)

(72) Inventors: Shunpei Yamazaki, Tokyo (JP); Jun Koyama, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/836,795

(22) Filed: Mar. 15, 2013

(65) Prior Publication Data

US 2013/0207125 A1 Aug. 15, 2013

Related U.S. Application Data

(60) Continuation of application No. 12/428,638, filed on Apr. 23, 2009, now Pat. No. 8,456,459, which is a continuation of application No. 10/858,445, filed on Jun. 2, 2004, now Pat. No. 7,525,523, which is a division of application No. 09/760,894, filed on Jan. 17, 2001, now Pat. No. 6,747,638.

(30) Foreign Application Priority Data

Jan. 31, 2000 (JP) .................................. 2000-022762

(51) Int. Cl.
| | |
|---|---|
| G09G 5/00 | (2006.01) |
| H01L 27/32 | (2006.01) |
| H01L 27/146 | (2006.01) |
| H01L 31/14 | (2006.01) |
| H04N 3/14 | (2006.01) |
| H01L 27/30 | (2006.01) |

(52) U.S. Cl.
CPC ............ *H01L 31/14* (2013.01); *H01L 27/3244* (2013.01); *H01L 27/3234* (2013.01); *H01L 27/30* (2013.01); *H01L 27/14678* (2013.01); *H04N 3/155* (2013.01)
USPC ............................................ 345/207; 345/81

(58) Field of Classification Search
USPC ........... 345/76–81, 205, 206, 207; 315/169.3; 257/88; 250/553
See application file for complete search history.

(56) References Cited

U.S. PATENT DOCUMENTS

| | | |
|---|---|---|
| 4,806,748 A | 2/1989 | Takami |
| 5,043,785 A | 8/1991 | Mizutani et al. |

(Continued)

FOREIGN PATENT DOCUMENTS

| | | |
|---|---|---|
| EP | 0 304 335 A2 | 2/1989 |
| EP | 0 503 401 A1 | 9/1992 |

(Continued)

OTHER PUBLICATIONS

Bryan Ackland et al., "Camera on a Chip", ISSCC96, Digest of Technical Papers. IEEE International Solid State Circuits Conference, 1996, pp. 22-25.

(Continued)

*Primary Examiner* — Tom Sheng
(74) *Attorney, Agent, or Firm* — Fish & Richardson P.C.

(57) ABSTRACT

A lightweight, thin, small size semiconductor device is provided. A pixel has a display portion, and a light receiving portion comprising a photodiode. A transistor is used with the semiconductor device for controlling the operation of the display portion and the light receiving portion.

16 Claims, 26 Drawing Sheets

(56) References Cited

U.S. PATENT DOCUMENTS

| | | |
|---|---|---|
| 5,296,698 A | 3/1994 | Tatoh |
| 5,313,055 A | 5/1994 | Shiratsuki |
| 5,349,174 A | 9/1994 | Van Berkel |
| 5,430,321 A | 7/1995 | Effelsberg |
| 5,446,564 A | 8/1995 | Mawatari |
| 5,501,989 A | 3/1996 | Takayama |
| 5,589,694 A | 12/1996 | Takayama |
| 5,625,210 A | 4/1997 | Lee |
| 5,627,364 A | 5/1997 | Codama |
| 5,670,792 A | 9/1997 | Utsugi |
| 5,744,822 A | 4/1998 | Takayama |
| 5,828,429 A | 10/1998 | Takemura |
| 5,841,159 A | 11/1998 | Lee |
| 5,904,493 A | 5/1999 | Lee |
| 5,920,401 A | 7/1999 | Street |
| 6,023,308 A | 2/2000 | Takemura |
| 6,027,955 A | 2/2000 | Lee |
| 6,040,810 A | 3/2000 | Nishimura |
| 6,087,679 A | 7/2000 | Yamazaki et al. |
| 6,160,272 A | 12/2000 | Arai |
| 6,188,380 B1 | 2/2001 | Kawashima et al. |
| 6,191,409 B1 | 2/2001 | Maramatsu |
| 6,243,069 B1 | 6/2001 | Ogawa et al. |
| 6,243,155 B1 | 6/2001 | Zhang et al. |
| 6,380,673 B1 | 4/2002 | Sekiya et al. |
| 6,392,617 B1 | 5/2002 | Gleason |
| 6,404,137 B1 | 6/2002 | Shodo |
| 6,452,212 B1 | 9/2002 | Codama et al. |
| 6,476,864 B1 | 11/2002 | Borg et al. |
| 6,480,305 B1 | 11/2002 | Resman |
| 6,495,886 B1 | 12/2002 | Yamazaki et al. |
| 6,518,962 B2 | 2/2003 | Kimura et al. |
| 6,559,433 B1 | 5/2003 | Ozawa |
| 6,692,984 B2 | 2/2004 | Yonezawa et al. |
| 6,693,301 B2 | 2/2004 | Takemura |
| 6,747,638 B2 | 6/2004 | Yamazaki et al. |
| 6,759,680 B1 | 7/2004 | Takemura |
| 6,815,654 B1 | 11/2004 | Fujieda et al. |
| 6,822,262 B2 | 11/2004 | Yamazaki et al. |
| 6,852,965 B2 | 2/2005 | Ozawa |
| 7,030,551 B2 | 4/2006 | Yamazaki et al. |
| 7,071,910 B1 | 7/2006 | Takemura |
| 7,116,302 B2 | 10/2006 | Takemura |
| 7,253,440 B1 | 8/2007 | Takemura |
| 7,297,978 B2 | 11/2007 | Yamazaki et al. |
| 7,362,322 B2 | 4/2008 | Kimura et al. |
| 7,525,523 B2 | 4/2009 | Yamazaki et al. |
| 7,928,438 B2 | 4/2011 | Yamazaki et al. |
| 2001/0031074 A1 | 10/2001 | Yamazaki |
| 2010/0295046 A1 | 11/2010 | Yamazaki et al. |

FOREIGN PATENT DOCUMENTS

| | | |
|---|---|---|
| EP | 0 569 090 A1 | 11/1993 |
| EP | 0 653 741 A1 | 5/1995 |
| EP | 0 738 010 A2 | 10/1996 |
| EP | 0 923 067 A1 | 6/1999 |
| EP | 0 942 583 A1 | 9/1999 |
| EP | 1 148 446 A2 | 10/2001 |
| EP | 1 351 484 A1 | 10/2003 |
| JP | 60-001646 B | 1/1985 |
| JP | 62-186320 A | 8/1987 |
| JP | 63-137959 U | 9/1988 |
| JP | 64-050460 A | 2/1989 |
| JP | 3175428 | 7/1991 |
| JP | 05-013742 A | 1/1993 |
| JP | 05-219301 A | 8/1993 |
| JP | 06-342900 A | 12/1994 |
| JP | 07-038134 A | 2/1995 |
| JP | 07-130974 A | 5/1995 |
| JP | 08-111516 A | 4/1996 |
| JP | 08-293620 A | 11/1996 |
| JP | 09-186312 A | 7/1997 |
| JP | 10-093785 A | 4/1998 |
| JP | 10-148848 A | 6/1998 |
| JP | 11-075115 A | 3/1999 |
| JP | 11-125841 A | 5/1999 |
| JP | 11345767 A | 12/1999 |
| WO | 98/40871 A1 | 9/1998 |

OTHER PUBLICATIONS

European Search Report (Application No. 01102260.5; EP4584) Dated Oct. 7, 2005, 4 pages.

R.M.A. Dawson et al.; "The Impact of the Transient Response of Organic Light Emitting Diodes on the Design of Active Matrix OLED Displays"; IEDM 98: Technical Digest of International Electron Devices Meeting; 1998; pp. 875-878.

E.R. Fossum et al., "A 37x28mm2 600k-Pixel CMOS APS Dental X-Ray Camera-on-a-Chip with Self-Triggered Readout," vol. 41, ISSCC98, Digest of Technical Papers. IEEE International Solid-State Circuits Conference, 1998, pp. 172-173.

Hitoshi Nomura et al., "A 256x256 BCAST Motion Detector with Simultaneous Video Output," ISSCC98, Digest of Technical Papers. IEEE International Solid-State Circuits Conference, 1998, pp. 282-283, 447.

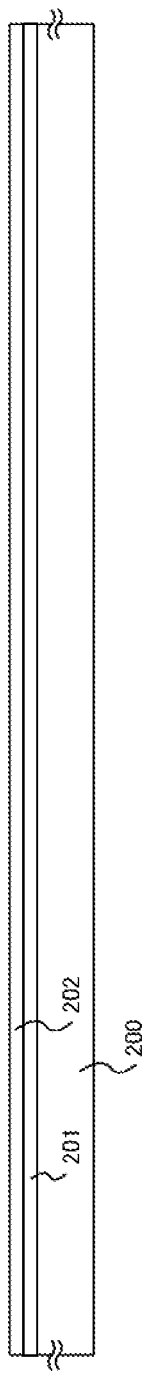
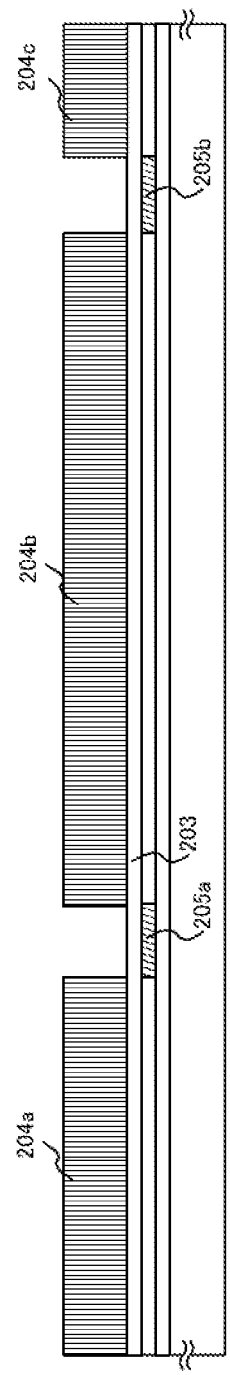
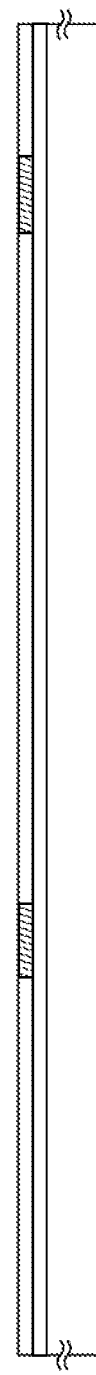
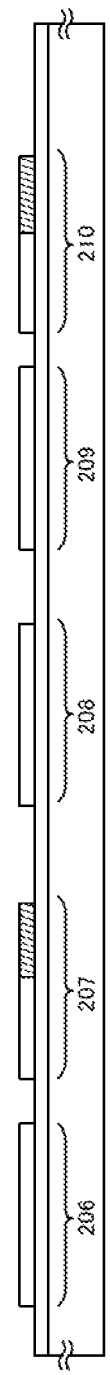
FIG. 14A CRYSTALLIZATION STEP
FIG. 14B
FIG. 14C LASER ANNEALING STEP
FIG. 14D

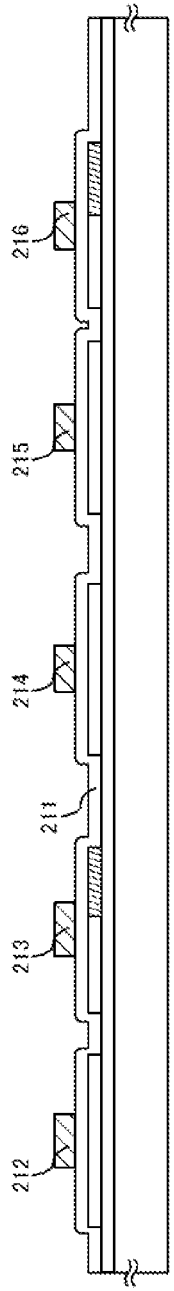
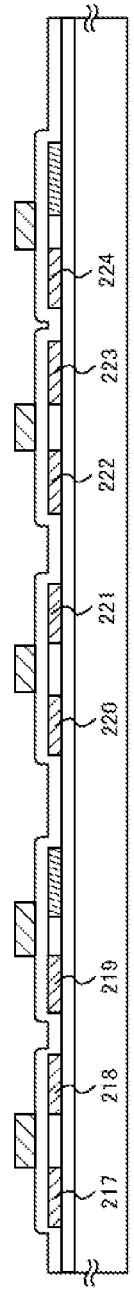
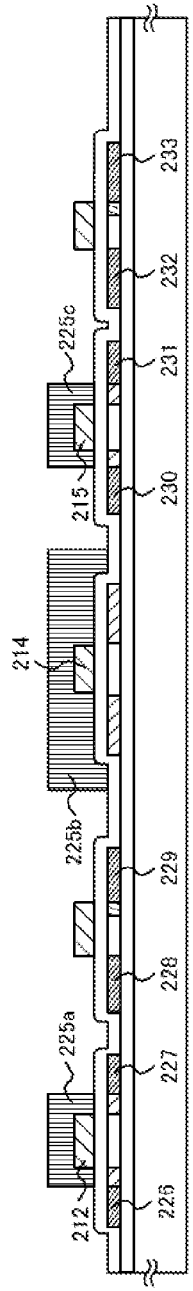
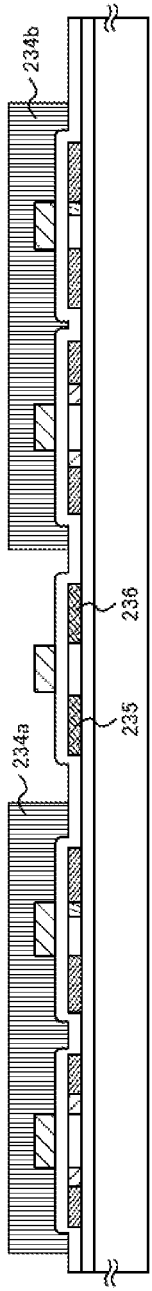
FIG. 15A
FIG. 15B
FIG. 15C
FIG. 15D

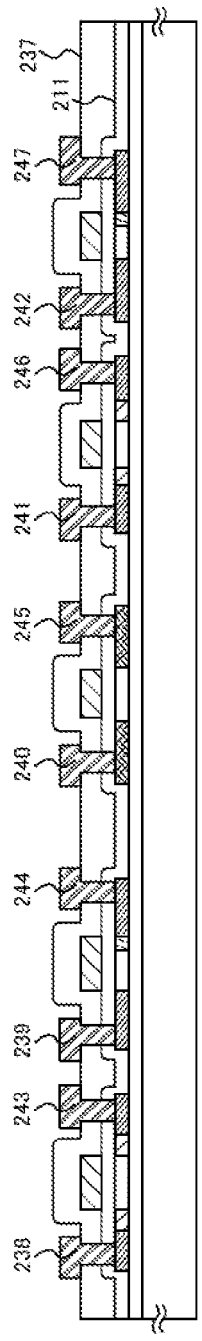
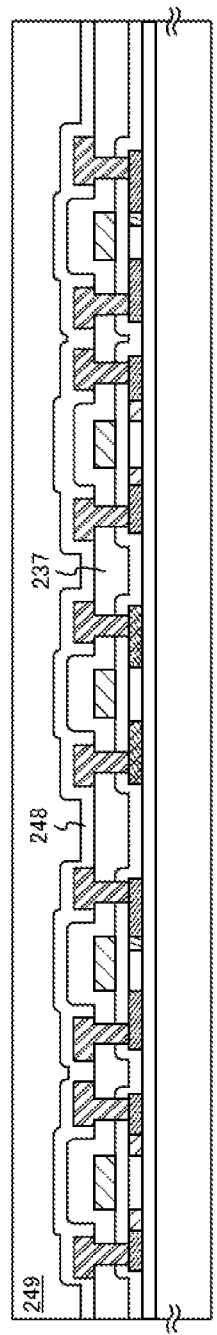
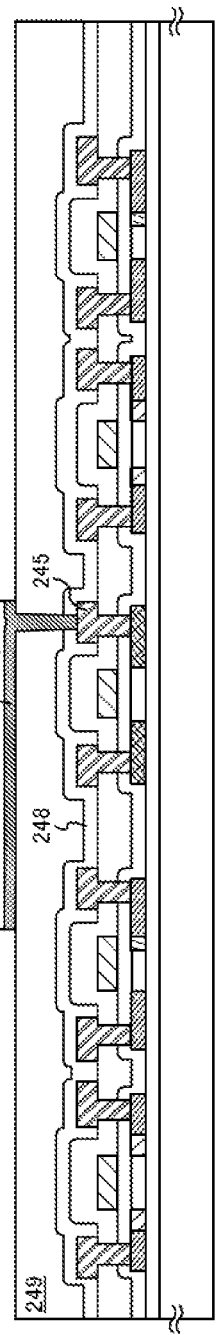
FIG. 16A
FIG. 16B
FIG. 16C

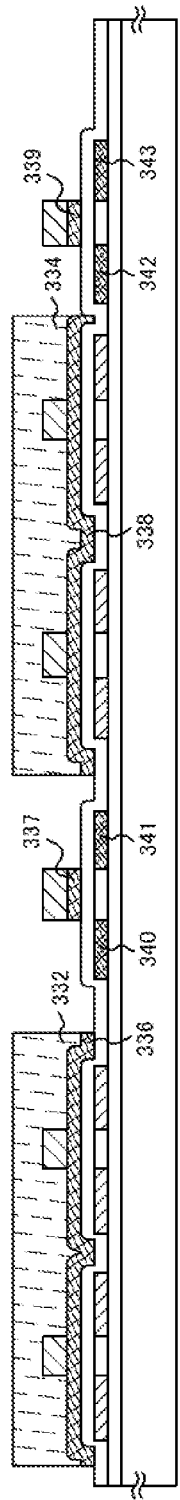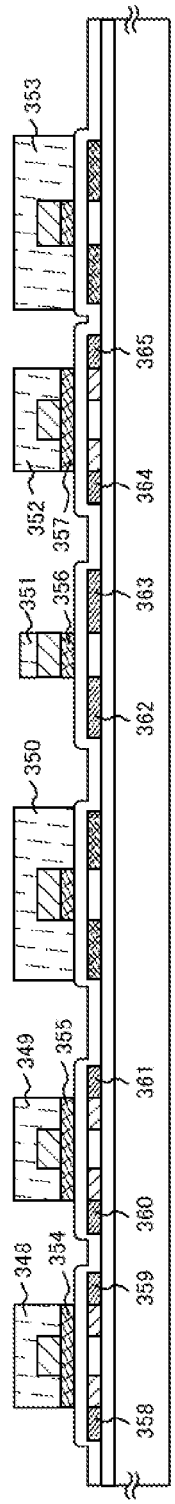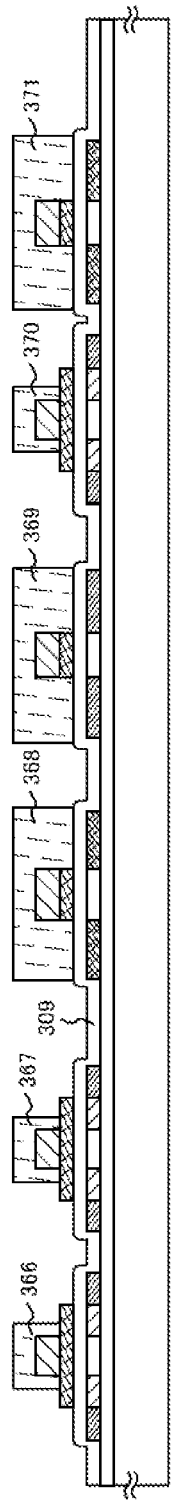

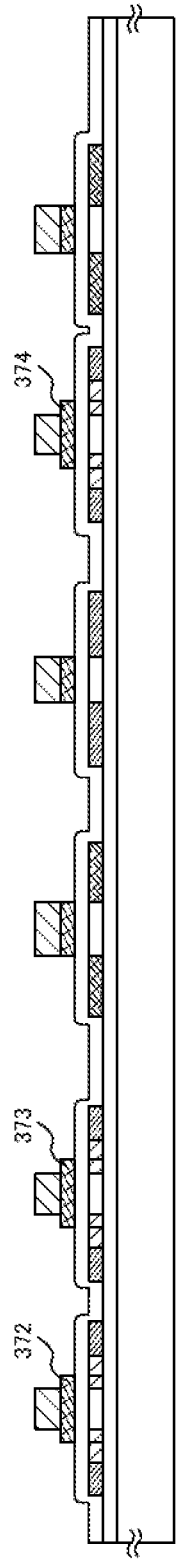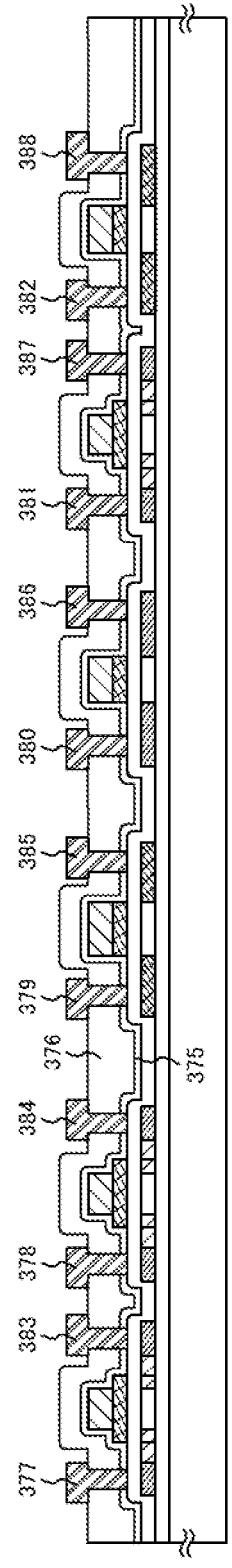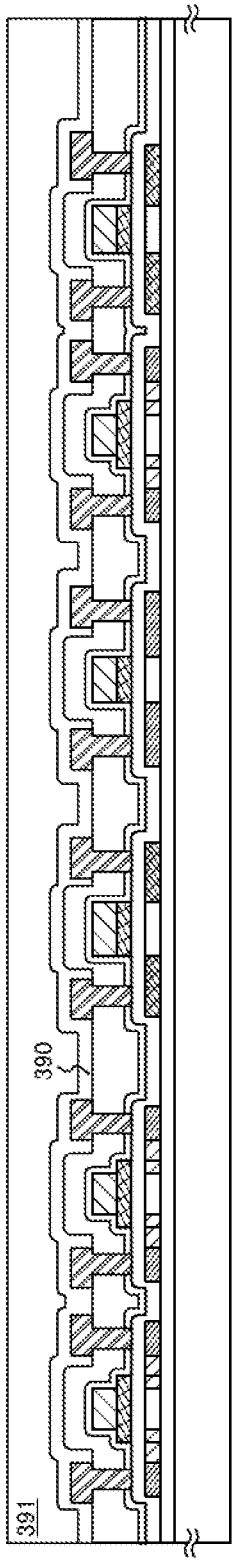

ADHESION TYPE AREA SENSOR AND DISPLAY DEVICE HAVING ADHESION TYPE AREA SENSOR

CROSS-REFERENCE TO RELATED APPLICATIONS

This application is a continuation of U.S. application Ser. No. 12/428,638, filed Apr. 23, 2009, now allowed, which is a continuation of U.S. application Ser. No. 10/858,445, filed Jun. 2, 2004, now U.S. Pat. No. 7,525,523, which is a divisional of U.S. application Ser. No. 09/760,894, filed Jan. 17, 2001, now U.S. Pat. No. 6,747,638, which claims the benefit of a foreign priority application filed in Japan as Serial No. 2000-022762 on Jan. 31, 2000, all of which are incorporated by reference.

BACKGROUND OF THE INVENTION

1. Field of the Invention

The present invention relates to an adhesion type (contact type) area sensor having an image sensor function. In particular, the present invention relates to an adhesion type area sensor having an EL element as a light source and structured by a plurality of thin film transistors arranged in a matrix shape. The EL element called a light emitting element or a light emitting diode or an OLED (Organic Light Emission. Diode) includes triplet-based light emission element and/or singlet-based light emission element, for example. Further, the present invention relates to a display device combined with an adhesion type area sensor.

2. Description of the Related Art

Solid state imaging devices having a photoelectric conversion element such as a diode or a CCD for outputting an electric signal having image information from an optical signal having information such as characters and drawings on a page, and picture information have come to be used in recent years The solid state imaging devices are used in devices such as scanners and digital cameras.

There are line sensors and area sensors in solid state imaging devices having a photoelectric conversion element. A line sensor takes in an image as an electrical signal by scanning photoelectric conversion elements formed in a linear shape over a subject.

In contrast, an area sensor, also referred to as an adhesion type area sensor, has photoelectric conversion elements formed in a plane and arranged above a subject, and takes in an image as an electrical signal. It is not necessary to scan the photoelectric conversion elements with the area sensor, differing from the linear sensor, and therefore components such as a motor for scanning are unnecessary.

FIGS. 24A and 24B show a structure of a conventional area sensor. Shown in FIG. 24A is a perspective view of the area sensor, while a cross sectional diagram of the area sensor is shown in FIG. 24B. A sensor substrate 2501 on which a photoelectric conversion element is formed, a backlight 2502, and a light scattering plate 2503 are formed as shown in the figures.

Light from the backlight 2502 as a light source is refracted within the light scattering plate 2503, and is irradiated to a subject 2504. The irradiated light is reflected by the subject 2504, and is irradiated on a photoelectric conversion element formed on the sensor substrate 2501. An electric current of a size corresponding to the brightness of the light is generated within the photoelectric conversion element when the light is irradiated to the photoelectric conversion element, and image information from the subject 2504 is taken in as an electrical signal within the area sensor.

If the light from the backlight 2502 is not irradiated uniformly to the subject 2504 with the area sensor stated above, an irregularity develops in which the read in image becomes partially brighter and partially darker. It therefore becomes necessary to devise a structure of the light scattering plate 2503 is so that the light is irradiated uniformly to the subject 2504, and to precisely regulate the position of the backlight 2502, the light scattering plate 2503, the sensor substrate 2501, and the subject 2504.

Furthermore, suppression of the size of the backlight 2502 and the size of the light scattering plate 2503 is difficult, and therefore making the area sensor itself smaller, thinner and lighter is impeded.

SUMMARY OF THE INVENTION

In view of the above stated conditions, an object of the present invention is to provide an adhesion type area sensor which is small in size, thin, and lightweight, and in which irregularities in brightness of a read in image do not develop.

The area sensor of the present invention uses a photodiode as a photoelectric conversion element. Further, an EL (electroluminescence) element is used as a light source.

The photodiode herein has a cathode, an anode, and a photoelectric conversion layer formed between the cathode and the anode. An electric current develops due to the photovoltaic effect when light is irradiated to the photoelectric conversion layer.

Further, the EL element is a self-light emitting type element, and is mainly used in an EL display. The EL display is also referred to as an organic EL display (GELD) or an organic light emitting diode (OLED).

The EL element has a structure in which a layer containing an organic compound (hereafter referred to as an EL layer) is sandwiched between a pair of electrodes (an anode and a cathode), and the EL layer normally has a lamination structure. Typically, the lamination structure of a hole transporting layer/light emitting layer/electron transporting layer, proposed by Tang, et al., of Eastman Kodak Co. is used. This structure has extremely high light emitting efficiency, and nearly all research and development into EL displays at present employs this structure.

Electroluminescence generated by the application of an electric field is obtained in the EL element, which has an anode layer, an EL layer, and a cathode layer. There is emission of light in luminescence of the organic compound when returning to a base state from a singlet excitation state (fluorescence), and when returning to a base state from a triplet excitation state (phosphorescence), and the area sensor of the present invention may use both types of light emission.

Furthermore, a structure in which a hole injecting layer, a hole transporting layer, a light emitting layer, and an electron transporting layer are laminated in order on an electrode; and a structure in which a hole injecting layer, a hole transporting layer, a light emitting layer, an electron transporting layer, and an electron injecting layer are laminated in order on an electrode may also be used. Doping of a material such as a fluorescent pigment into the light emitting layer may also be performed.

All layers formed between one pair of electrodes are referred to generically as an EL layer within this specification. Therefore, the above stated hole injecting layer, hole transporting layer, light emitting layer, electron transporting layer, and electron injecting layer are all contained within the EL layer.

Photodiodes and EL elements are formed in a matrix shape on the same sensor substrate. The operation of the photodiodes and the EL elements is then controlled using thin film transistors (TFTs) formed on the substrate in the same matrix shape.

Light emitted from the EL elements is reflected by a subject and irradiated to the photodiodes. An electric current is generated in accordance with the light irradiated to the photodiodes and an electrical signal having image information of the subject (image signal) is input to the area sensor.

No irregularities in the brightness of the read in image develop with the present invention because light is irradiated uniformly to the subject in accordance with the above structure. It is not necessary to form the backlight and the light scattering plate separately from the sensor substrate, and therefore it is also not necessary to precisely regulate the position of the backlight, the light scattering plate, the sensor substrate, and the subject, differing from the conventional example. A miniaturized, thin, light area sensor can therefore be realized. Furthermore, the mechanical strength of the area sensor itself is increased.

With the area sensor of the present invention it is possible to display an image by the area sensor using the EL elements. The EL elements in the present invention possess a combination of a function as a light source when reading in an image, and a function as a light source for displaying an image. Display of an image is therefore possible without forming a separate electronic display in the area sensor.

Structures of the present invention are shown below.

According to the present invention there is provided:

an adhesion type area sensor comprising a sensor portion, having a plurality of pixels, formed on a sensor substrate, characterized in that:

the plurality of pixels have a photodiode, an EL element, and a plurality of thin film transistors.

According to the present invention there is provided:

an adhesion type area sensor comprising a sensor portion, having a plurality of pixels, formed on a sensor substrate, characterized in that:

the plurality of pixels have a photodiode, an EL element, a switching TFT, an EL driver TFT, a reset TFT, a buffer TFT, and a selection TFT;

the switching TFT and the EL driver TFT control light emitted from the EL element;

the light emitted from the EL element is reflected by a subject and irradiated to the photodiode; and the photodiode, the reset TFT, the buffer TFT, and the selection TFT generate an image signal from the light irradiated to the photodiode.

According to the present invention there is provided:

an adhesion type area sensor comprising a sensor portion, having a plurality of pixels, formed on a sensor substrate, characterized in that:

the plurality of pixels have a photodiode, an EL element, a switching TFT, an EL driver TFT, a reset TFT, a buffer TFT, a selection TFT; a source signal line; a gate signal line; an electric power source supply line for maintaining a constant electric potential; a reset gate signal line; a sensor gate signal line; a sensor output wiring connected to a constant electric current power supply; and a sensor electric power source line for maintaining a constant electric potential;

a gate electrode of the switching TFT is connected to the gate signal line;

one of a source region and a drain region of the switching TFT is connected to the source signal line, and the other is connected to a gate electrode of the EL driver TFT;

one of a source region and a drain region of the EL driver TFT is connected to the electric power source supply line, and the other is connected to the EL element;

a source region of the reset TFT is connected to the sensor electric power source line;

a drain region of the reset TFT is connected to a gate electrode of the buffer TFT and to the photodiode;

a drain region of the buffer TFT is connected to the sensor electric power source line;

one of a source region and a drain region of the selection TFT is connected to the sensor output wiring, and the other is connected to a source region of the buffer TFT;

a gate electrode of the selection TFT is connected to the sensor gate signal line;

light emitted from the EL element is reflected by a subject and irradiated to the photodiode; and an image signal generated from the light irradiated to the photodiode is input to the sensor output wiring.

According to the present invention there is provided:

an adhesion type area sensor comprising a sensor portion, having a plurality of pixels, formed on a substrate, characterized in that:

the plurality of pixels have a photodiode, an EL element, a switching TFT, an EL driver TFT, a reset TFT, a buffer TFT, a selection TFT; a source signal line; a gate signal line; an electric power source supply line for maintaining a constant electric potential; a reset gate signal line; a sensor gate signal line; a sensor output wiring connected to a constant electric current power supply; and a sensor electric power source line for maintaining a constant electric potential;

a gate electrode of the switching TFT is connected to the gate signal line;

one of a source region and a drain region of the switching TFT is connected to the source signal line, and the other is connected to a gate electrode of the EL driver TFT;

one of a source region and a drain region of the EL driver TFT is connected to the electric power source supply line, and the other is connected to the EL element;

a source region of the reset TFT is connected to the sensor electric power source line;

a drain region of the reset TFT is connected to a gate electrode of the buffer TFT and to the photodiode;

a drain region of the buffer TFT is connected to the sensor electric power source line;

one of a source region and a drain region of the selection TFT is connected to the sensor output wiring, and the other is connected to a source region of the buffer TFT;

a gate electrode of the selection TFT is connected to the gate signal line;

the polarity of the switching TFT and the selection TFT is the same;

light emitted from the EL element is reflected by a subject and irradiated to the photodiode; and an image signal generated from the light irradiated to the photodiode is input to the sensor output wiring.

According to the present invention there is provided:

an adhesion type area sensor comprising a sensor portion, having a plurality of pixels, formed on a sensor substrate, characterized in that:

the plurality of pixels have a photodiode, an EL element, a switching TFT, an EL driver TFT, a reset TFT, a buffer TFT, a selection TFT; a source signal line; a gate signal line; an electric power source supply line for maintaining a constant electric potential; a reset gate signal line; a sensor gate signal line; a sensor output wiring connected to a constant electric current power supply; and a sensor electric power source line for maintaining a constant electric potential;

a gate electrode of the switching TFT is connected to the gate signal line;

one of a source region and a drain region of the switching TFT is connected to the source signal line, and the other is connected to a gate electrode of the EL driver TFT;

one of a source region and a drain region of the EL driver TFT is connected to the electric power source supply line, and the other is connected to the EL element;

a source region of the reset TFT is connected to the sensor electric power source line;

a drain region of the reset TFT is connected to a gate electrode of the buffer TFT and to the photodiode;

a drain region of the buffer TFT is connected to the sensor electric power source line;

one of a source region and a drain region of the selection TFT is connected to the sensor output wiring, and the other is connected to a source region of the buffer TFT;

a gate electrode of the selection TFT is connected to the gate signal line;

the reset TFT and the selection TFT are switched from ON state to an OFF state, or from an OFF state to an ON state at the same time in accordance with the signal input to the reset gate signal line and the sensor gate signal line;

when one of the reset TFT and the selection TFT is in an ON state, the other is in an OFF state;

light emitted from the EL element is reflected by a subject and irradiated to the photodiode; and an image signal generated from the light irradiated to the photodiode is input to the sensor output wiring.

According to the present invention there is provided;

an adhesion type area sensor comprising a sensor portion, having a plurality of pixels, formed on a substrate, characterized in that:

the plurality of pixels have a photodiode, an EL element, a switching TFT, an EL driver TFT, a reset TFT, a buffer TFT, a selection TFT; a source signal line; a gate signal line; an electric power source supply line for maintaining a constant electric potential; a reset gate signal line; a sensor gate signal line; a sensor output wiring connected to a constant electric current power supply; and a sensor electric power source line for maintaining a constant electric potential;

a gate electrode of the switching TFT is connected to the gate signal line;

one of a source region and a drain region of the switching TFT is connected to the source signal line, and the other is connected to a gate electrode of the EL driver TFT;

one of a source region and a drain region of the EL driver TFT is connected to the electric power source supply line, and the other is connected to the EL element;

a source region of the reset TFT is connected to the sensor electric power source line;

a drain region of the reset TFT is connected to a gate electrode of the buffer TFT and to the photodiode;

a drain region of the buffer TFT is connected to the sensor electric power source line;

one of a source region and a drain region of the selection TFT is connected to the sensor output wiring, and the other is connected to a source region of the buffer TFT;

a gate electrode of the selection TFT is connected to the sensor gate signal line;

the reset TFT and the selection TFT are switched from an ON state to an OFF state, or from an OFF state to an ON state at the same time in accordance with the signal input to the reset gate signal line and the sensor gate signal line;

when one of the reset TFT and the selection TFT is in an ON state, the other is in an OFF state;

light emitted from the EL element is reflected by a subject and irradiated to the photodiode; and an image signal generated from the light irradiated to the photodiode is input to the sensor output wiring.

According to the present invention there is provided;

a display device comprising a sensor portion, having a plurality of pixels, formed on a substrate, characterized in that:

the plurality of pixels have a photodiode, an EL element, a switching TFT, an EL driver TFT, a reset TFT, a buffer TFT, and a selection TFT;

light emitted from the EL element is controlled in accordance with the switching TFT and the EL driver TFT; and the sensor portion displays an image in accordance with the light emitted from the EL element; or the light emitted from the EL element is irradiated to the photodiode by being reflected by a subject, and an image signal is generated from the light irradiated to the photodiode in accordance with the photodiode, the reset TFT, the buffer TFT, and the selection TFT.

According to the present invention there is provided;

an adhesion type area sensor comprising a sensor portion, having a plurality of pixels, formed on a sensor substrate, characterized in that;

the plurality of pixels have a photodiode, an EL element, a switching TFT, an EL driver TFT, a reset TFT, a buffer TFT, a selection TFT; a source signal line; a gate signal line; an electric power source supply line for maintaining a constant electric potential; a reset gate signal line; a sensor gate signal line; a sensor output wiring connected to a constant electric current power supply; and a sensor electric power source line for maintaining a constant electric potential;

a gate electrode of the switching TFT is connected to the gate signal line;

one of a source region and a drain region of the switching TFT is connected to the source signal line, and the other is connected to a gate electrode of the EL driver TFT;

one of a source region and a drain region of the EL driver TFT is connected to the electric power source supply line, and the other is connected to the EL element;

a source region of the reset TFT is connected to the sensor electric power source line;

a drain region of the reset TFT is connected to a gate electrode of the buffer TFT and to the photodiode;

a drain region of the buffer TFT is connected to the sensor electric power source line;

one of a source region and a drain region of the selection. TFT is connected to the sensor output wiring, and the other is connected to a source region of the buffer TFT;

a gate electrode of the selection TFT is connected to the sensor gate signal line:

light emitted from the EL element is controlled in accordance with the switching TFT and the EL driver TFT: and the sensor portion displays an image in accordance with the light emitted from the EL element; or the light emitted from the EL element is irradiated to the photodiode by being reflected by a subject, and an image signal is generated from the light irradiated to the photodiode in accordance with the photodiode, the reset TFT, the buffer TFT, and the selection TFT.

According to the present invention there is provided;

an adhesion type area sensor comprising a sensor portion, having a plurality of pixels, formed on a sensor substrate, characterized in that:

the plurality of pixels have a photodiode, an EL element, a switching TFT, an EL driver TFT, a reset TFT, a buffer TFT, a selection TFT; a source signal line; a gate signal line; an electric power source supply line for maintaining a constant electric potential; a reset gate signal line; a sensor gate signal line; a sensor output wiring connected to a constant electric current power supply; and a sensor electric power source line for maintaining a constant electric potential;

a gate electrode of the switching TFT is connected to the gate signal line;

one of a source region and a drain region of the switching TFT is connected to the source signal line, and the other is connected to a gate electrode of the EL driver TFT;

one of a source region and a drain region of the EL driver TFT is connected to the electric power source supply line, and the other is connected to the EL element;

a source region of the reset TFT is connected to the sensor electric power source line;

a drain region of the reset TFT is connected to a gate electrode of the buffer TFT and to the photodiode;

a drain region of the buffer TFT is connected to the sensor electric power source line;

one of a source region and a drain region of the selection TFT is connected to the sensor output wiring, and the other is connected to a source region of the buffer TFT;

a gate electrode of the selection TFT is connected to the sensor gate signal line;

the reset TFT and the selection TFT are switched from an ON state to an OFF state, or from an OFF state to an ON state at the same time in accordance with the signal input to the reset gate signal line and the sensor gate signal line;

when one of the reset. TFT and the selection TFT is in an ON state, the other is in an OFF state;

light emitted from the EL element is controlled in accordance with the switching TFT and the EL driver TFT; and the sensor portion displays an image in accordance with the light emitted from the EL element; or the light emitted from the EL element is irradiated to the photodiode by being reflected by a subject, and an image signal is generated from the light irradiated to the photodiode in accordance with the photodiode, the reset TFT, the buffer TFT, and the selection TFT.

According to the present invention there is provided;

an adhesion type area sensor comprising a sensor portion, having a plurality of pixels, formed on a sensor substrate, characterized in that:

the plurality of pixels have a photodiode, an EL element, a switching TFT, an EL driver TFT, a reset TFT, a buffer TFT, a selection TFT; a source signal line; a gate signal line; an electric power source supply line for maintaining a constant electric potential; a reset gate signal line; a sensor gate signal line; a sensor output wiring connected to a constant electric current power supply; and a sensor electric power source line for maintaining a constant electric potential;

a gate electrode of the switching TFT is connected to the gate signal line;

one of a source region and a drain region of the switching TFT is connected to the source signal line, and the other is connected to a gate electrode of the EL driver TFT;

one of a source region and a drain region of the EL driver TFT is connected to the electric power source supply line, and the other is connected to the EL element;

a source region of the reset TFT is connected to the sensor electric power source line;

a drain region of the reset TFT is connected to a gate electrode of the buffer TFT and to the photodiode;

a drain region of the buffer TFT is connected to the sensor electric power source line;

one of a source region and a drain region of the selection TFT is connected to the sensor output wiring, and the other is connected to a source region of the buffer TFT;

a gate electrode of the selection TFT is connected to the sensor gate signal line;

the polarity of the switching TFT and the selection TFT are the same;

light emitted from the EL element is controlled in accordance with the switching TFT and the EL driver TFT; and the sensor portion displays an image in accordance with the light emitted from the EL element; or the light emitted from the EL element is irradiated to the photodiode by being reflected by a subject, and an image signal is generated from the light irradiated to the photodiode in accordance with the photodiode, the reset TFT, the buffer TFT, and the selection TFT.

According to the present invention there is provided;

an adhesion type area sensor comprising a sensor portion, having a plurality of pixels, formed on a sensor substrate, characterized in that:

the plurality of pixels have a photodiode, an EL element, a switching TFT, an EL driver TFT, a reset TFT, a buffer TFT, a selection TFT; a source signal line; a gate signal line; an electric power source supply line for maintaining a constant electric potential; a reset gate signal line; a sensor gate signal line; a sensor output wiring connected to a constant electric current power supply; and a sensor electric power source line for maintaining a constant electric potential;

a gate electrode of the switching TFT is connected to the gate signal line;

one of a source region and a drain region of the switching TFT is connected to the source signal line, and the other is connected to a gate electrode of the EL driver TFT;

one of a source region and a drain region of the EL driver TFT is connected to the electric power source supply line, and the other is connected to the EL element;

a source region of the reset TFT is connected to the sensor electric power source line;

a drain region of the reset TFT is connected to a gate electrode of the buffer TFT and to the photodiode;

a drain region of the buffer TFT is connected to the sensor electric power source line;

one of a source region and a drain region of the selection TFT is connected to the sensor output wiring, and the other is connected to a source region of the buffer TFT;

a gate electrode of the selection TFT is connected to the sensor gate signal line;

the polarity of the switching TFT and the selection TFT are the same;

the reset TFT and the selection TFT are switched from an ON state to an OFF state, or from an OFF state to an ON state at the same time in accordance with the signal input to the reset gate signal line and the sensor gate signal line;

when one of the reset TFT and the selection TFT is in an ON state, the other is in an OFF state;

light emitted from the EL element is controlled in accordance with the switching TFT and the EL driver TFT; and the sensor portion displays an image in accordance with the light emitted from the EL element; or the light emitted from the EL element is irradiated to the photodiode by being reflected by a subject, and an image signal is generated from the light irradiated to the photodiode in accordance with the photodiode, the reset TFT, the buffer TFT, and the selection TFT.

The EL element may have an anode, a cathode, and an EL layer formed between the anode and the cathode.

The EL driver TFT may be a p-channel TFT when the anode of the EL element is connected to a source region or a drain region of the EL driver TFT.

The EL driver TFT may be an n-channel TFT when the cathode of the EL element is connected to the source region or the drain region of the EL driver TFT.

The photodiode may have a cathode, an anode, and a photoelectric conversion layer formed between the cathode and the anode.

The reset TFT may be an n-channel TFT and the buffer TFT may be a p-channel TFT when the anode of the photodiode is connected to a drain region of the reset TFT.

The reset TFT may be a p-channel TFT and the buffer TFT may be an n-channel TFT when the cathode of the photodiode is connected to the drain region of the reset TFT.

The display device may have a touch pen and a touch panel.

BRIEF DESCRIPTION OF THE DRAWINGS

In the accompanying drawings;

FIGS. 14A to 14D are diagrams of a process of manufacturing a sensor portion;
FIGS. 15A to 15D are diagrams of the process of manufacturing the sensor portion;
FIGS. 16A to 16C are diagrams of the process of manufacturing the sensor portion;
FIGS. 19A to 19C are diagrams of the process of manufacturing the sensor portion;
FIGS. 20A to 20C are diagrams of the process of manufacturing the sensor portion.

DETAILED DESCRIPTION OF THE PREFERRED EMBODIMENTS

Embodiment Mode

Figure 1:
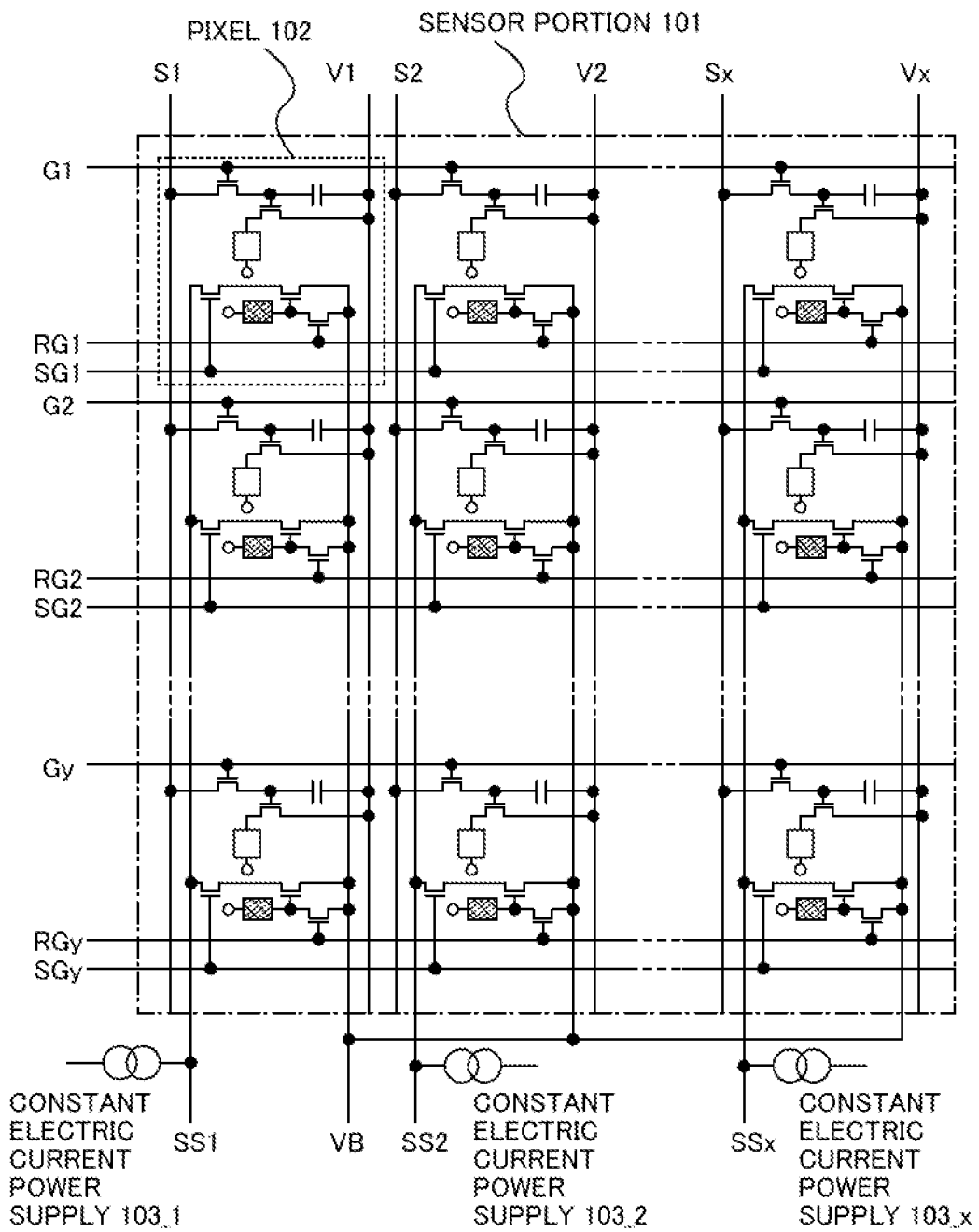
FIG. 1 is a circuit diagram of a sensor portion.

A structure of an area sensor of the present invention is explained in detail below. The area sensor of the present invention has a sensor portion for performing read in of an image, and a driver portion for controlling the driving of the sensor portion. A circuit diagram of the sensor portion of the present invention is shown in FIG. 1.

Source signal lines S1 to Sx, electric power source supply lines V1 to Vx, gate signal lines G1 to Gy, reset gate signal lines RG1 to RGy, sensor gate signal lines SG1 to SGy, sensor output wirings SS1 to SSx, and a sensor electric power source line VB are formed in a sensor portion 101.

The sensor portion 101 has a plurality of pixels 102. The pixels 102 have one of the source signal lines S1 to Sx, one of the electric power source supply lines V1 to Vx, one of the gate signal lines G1 to Gy, one of the reset gate signal lines RG1 to RGy, one of the sensor gate signal lines SG1 to SGy, one of the sensor output wirings SS1 to SSx, and the sensor electric power source line VB.

The sensor output wirings SS1 to SSx are connected to constant electric current power supplies 103_1 to 103_x, respectively.

Figure 2:
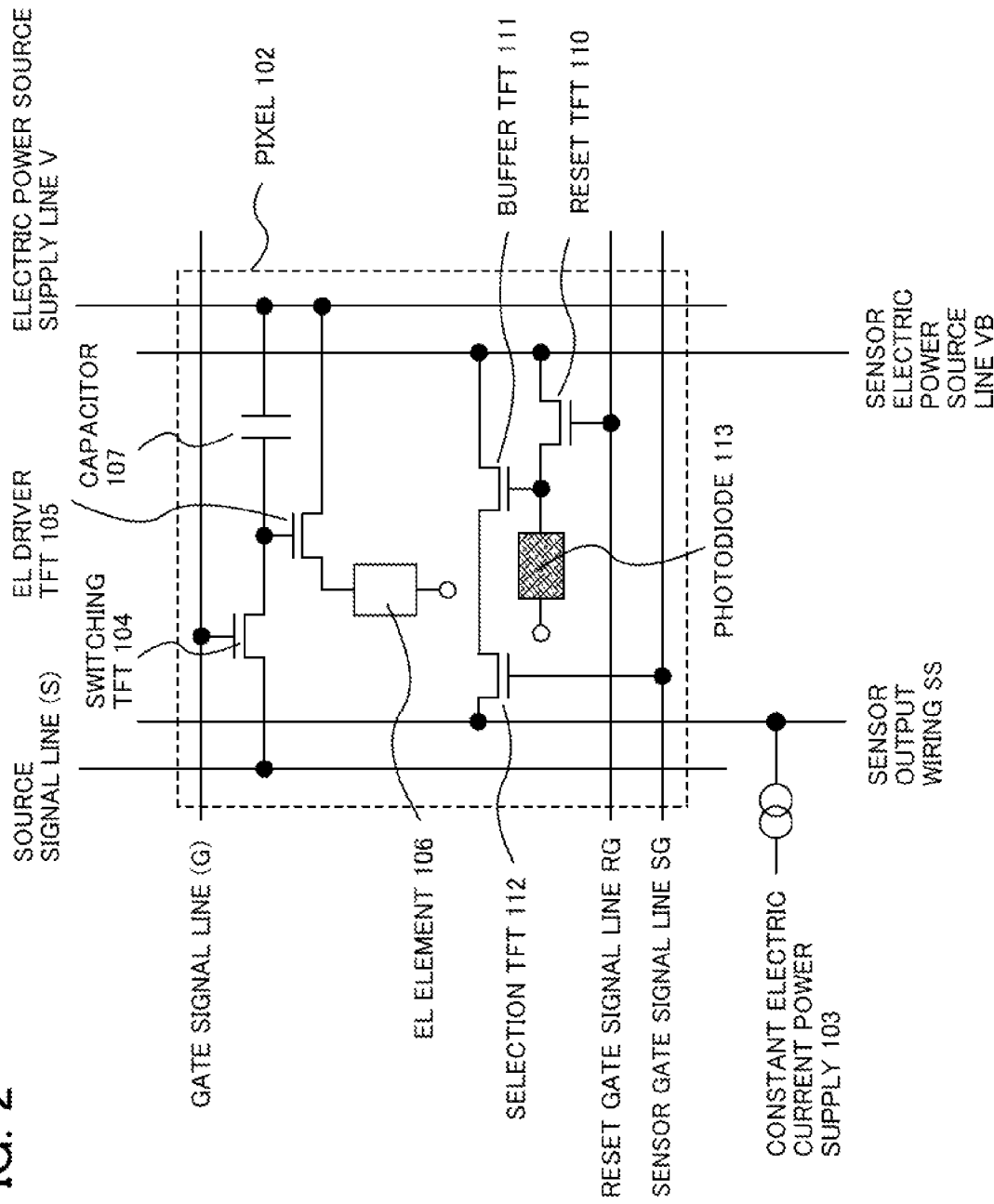
FIG. 2 is a circuit portion of a pixel.

A detailed structure of the pixel 102 is shown in FIG. 2. A region enclosed by a dotted line is the pixel 102. Note that a source signal line S denotes one of the source signal lines S1 to Sx. Further, an electric power source supply line V denotes one of the electric power source supply lines V1 to Vx. A gate signal line G denotes one of the gate signal lines G1 to Gy, and a reset gate signal line RG denotes one of the reset gate signal lines RG1 to RGy. In addition, a sensor gate signal line SG denotes one of the sensor gate signal lines SG1 to SGy, and a sensor output wiring SS denotes one of the sensor output wirings SS1 to SSx.

The pixel 102 has a switching TFT 104, an EL driver TFT 105, and an EL element 106. Further, in FIG. 2 a capacitor 107 is formed in the pixel 102, but the capacitor 107 need not be formed.

The EL element 106 is composed of an anode, a cathode, and an EL layer formed between the anode and the cathode. When the anode is connected to a source region or a drain region of the EL driver TFT 105, the anode is a pixel electrode and the cathode is an opposing electrode. Conversely, when the cathode is connected to a source region or a drain region of the EL driver TFT 105, the anode is the opposing electrode and the cathode is the pixel electrode.

A gate electrode of the switching TFT 104 is connected to the gate signal line G. One of a source region and a drain region of the switching TFT 104 is connected to the source signal line S, and the other is connected to a gate electrode of the EL driver TFT 105.

One of the source region and the drain region of the EL driver TFT 105 is connected to the electric power source supply line V, and the other is connected to the EL element 106. The capacitor 107 is formed connected to the gate electrode of the EL driver TFT 105 and to the electric power source supply line V.

In addition, the pixel 102 has a reset TFT 110, a buffer TFT 111, a selection TFT 112, and a photodiode 113.

A gate electrode of the reset TFT 110 is connected to the reset gate signal line RG. A source region of the reset TFT 110 is connected to the sensor electric power source line VB, and the sensor electric power source line VB is always maintained at a constant electric potential (reference electric potential).

Further, a drain region of the reset TFT 110 is connected to the photodiode 113 and to a gate electrode of the buffer TFT 111.

Although not shown in the figure, the photodiode 113 has a cathode electrode, an anode electrode, and a photoelectric conversion layer formed between the cathode electrode and the anode electrode. The drain region of the reset TFT 110 is connected specifically to the anode electrode or the cathode electrode of the photodiode 113.

A drain region of the buffer TFT 111 is connected to the sensor electric power source line VB, and is always maintained at the reference electric potential. A source region of the buffer TFT is connected to a source region or a drain region of the selection TFT 112.

A gate electrode of the selection TFT 112 is connected to the gate signal line SG. One of the source region and the drain region of the selection TFT 112 is connected to the source region of the buffer TFT 111, as stated above, and the other is connected to the sensor output wiring SS. The sensor output wiring SS is connected to the constant electric current power supply 103 (one of the constant electric current power supply 103_1 to 103_x), and a constant electric current always flows.

An explanation of a method of driving the area sensor of the present invention is explained next using FIG. 1 and FIG. 2.

The EL element 106 of the pixel 102 functions as a light source of the area sensor, and the switching TFT 104, the EL driver TFT 105, and the capacitor 107 control the operation of the EL element 106 as the light source.

Light emitted from the EL element is reflected by a subject and irradiated to the photodiode 113 of the pixel 102. The photodiode 113 converts the irradiated light to an electrical signal having image information. The electrical signal having image information which is generated by the photodiode 113 is then taken in the area sensor as an image signal by the reset TFT 110, the buffer TFT 111 and the selection TFT 112.

Figure 3:
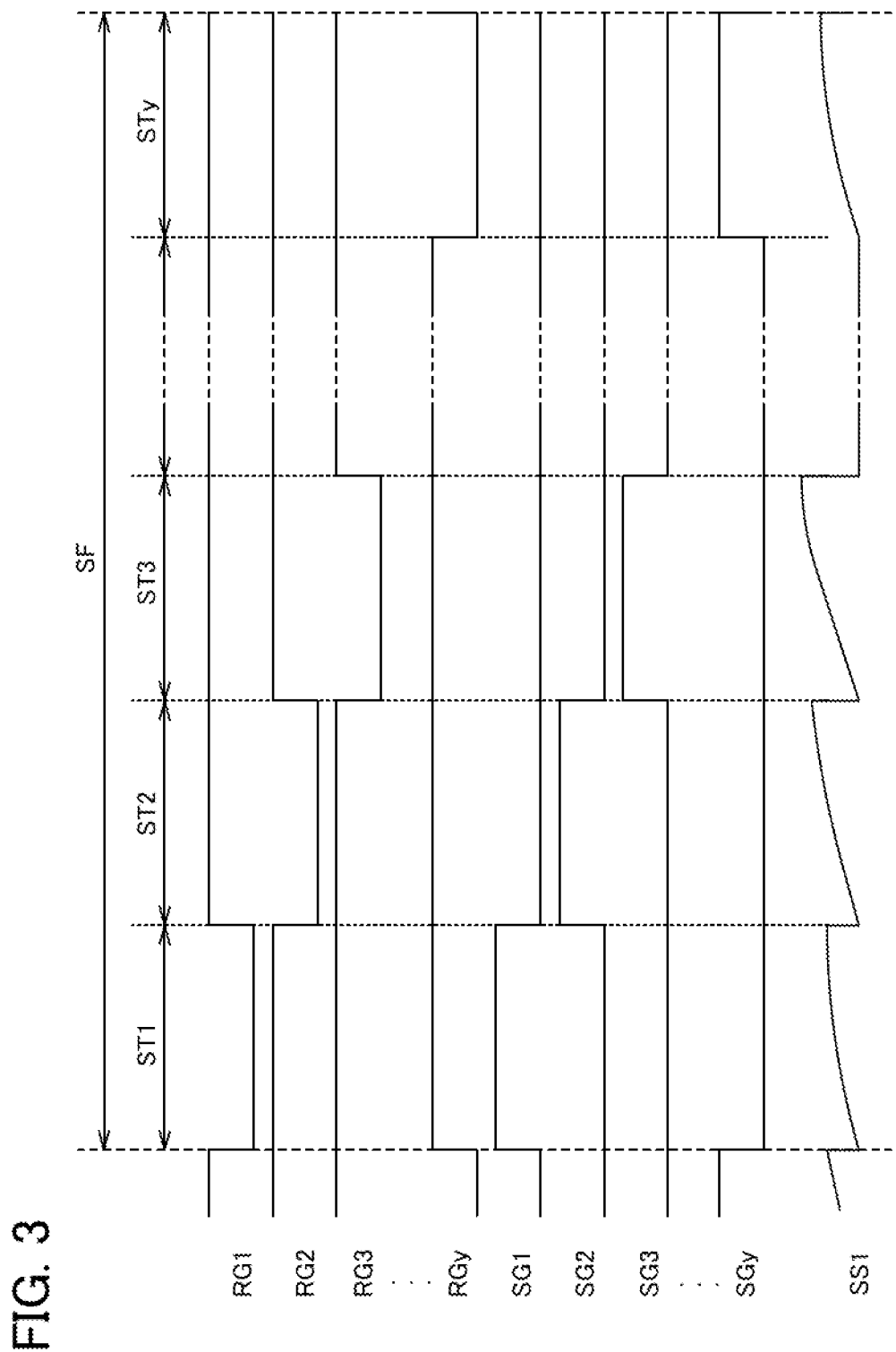
FIG. 3 is a timing chart of read in of an image to a sensor portion.

FIG. 3 is a timing chart showing the operation of the reset TFT 110, the buffer TFT 111, and the selection TFT 112. Note that a timing chart for a case in which the reset TFT 110 is an n-channel TFT, the buffer TFT 111 is a p-channel TFT, and the selection TFT 112 is an n-channel TFT is shown here. The reset TFT 110, the buffer TFT 111, and the selection TFT 112 may each be either an n-channel TFT or a p-channel TFT in the present invention. However, it is preferable that the reset. TFT 110 and the buffer TFT 111 have opposite polarities.

First, the reset TFTs 110 of a first line of pixels connected to the reset gate signal line RG1 are placed in an ON state in accordance with a reset signal inputted to the reset gate signal line RG1. The reference electric potential of the sensor electric power source line. VB is therefore applied to the gate electrode of the buffer TFT 111.

Further, the selection TFTs 112 of a first line of pixels connected to the sensor gate signal line SG1 are placed in an OFF state in accordance with a sensor signal inputted to the sensor gate signal line SG1. The source region of the buffer TFT 111 is therefore maintained at an electric potential in which an electric potential difference $V_{GS}$ between the source region and the drain region of the buffer TFT 111 is subtracted from the reference electric potential. Note that a period during which the reset TFT 110 is in an ON state is referred to as a reset period throughout this specification.

The electric potential of the reset signal inputted to the reset gate signal line RG1 is then changed, and all of the reset TFTs 110 of the first line of pixels are placed in an OFF state. The reference electric potential of the sensor electric power source line V13 is therefore no longer applied to the gate electrodes of the buffer TFTs 111 of the first line of pixels. Note that a period during which the reset TFT 110 is in an OFF state is referred to as a sample period ST throughout this specification. In particular, a period during which the reset TFTs 110 of the first line of pixels is in an OFF state is referred to as a sample period ST1.

The electric potential of the sensor signal inputted to the sensor gate signal line SG1 changes in the sample period ST1, and the selection TFTs 112 of the first line of pixels are placed in an ON state. The source regions of the buffer TFTs 111 of the first line of pixels are therefore electrically connected to the sensor output wiring 551 through the selection TFTs 112. The sensor output wiring 551 is connected to the constant electric current power supply 103_1. Therefore, the buffer TFTs 111 function as source followers, and the electric potential difference V between the source region and the gate electrode is constant.

An electric current flows in the photodiode 113 in the sample period ST1 when the light from the EL element 106 is reflected by a subject and irradiated to the photodiode 113. The electric potential of the gate electrode of the buffer TFT 111, maintained at the reference electric potential during the reset period, therefore becomes higher in correspondence with the amount of electric current which develops in the photodiode 113.

The electric current flowing in the photodiode 113 is proportional to the strength of the light irradiated to the photodiode 113, and therefore the image of the subject is converted as is into an electrical signal in the photodiode 113. The electrical signal generated in the photodiode 113 is inputted to the gate electrode of the buffer TFT 111.

The electric potential difference $V_{GS}$ between the source region and the gate electrode of the buffer TFT 111 is always constant, and therefore the source region of the buffer TFT 111 maintains an electric potential in which $V_{Gs}$ is subtracted from the electric potential of the gate electrode of the buffer TFT 111. Therefore, if the electric potential of the gate electrode of the buffer TFT 111 changes, the electric potential of the source region of the buffer TFT 111 also changes in accompaniment.

The electric potential of the source region of the buffer TFT 111 is inputted to the sensor output wiring SS1, through the selection TFT 112, as an image signal.

Next, the reset TFTs 110 of the first line of pixels connected to the reset gate signal line RG1 are placed in an ON state in accordance with the reset signal inputted to the reset gate signal line RG1, and the reset period again begins. The reset TFTs 110 of a second line of pixels connected to the reset gate signal line RG2 are simultaneously placed in an OFF state in accordance with the reset signal inputted to the reset gate signal line RG2, and a sampling period ST2 begins.

An electrical signal having image information is generated in the photodiode in the sampling period ST2, similar to what occurs in the sampling period ST1, and the image signal inputted to the sensor output wiring 552.

If the above operations are repeated, one image can be read in as an image signal when the sampling period STy is completed. Note that a period up through the appearance of all of the sampling periods ST1 to STy is referred to as a sensor frame period SF in this specification.

Further, it is necessary to make the EL elements of respective pixels always emit light in each of the sampling periods. For example, it is necessary for the EL elements of the first line of pixels to emit light during at least the sampling period ST1. Note that all of the pixels may always emit light during the sensor frame period SF.

Note also that for a case of an area sensor into which a color image is read, the sensor portion has pixels corresponding to each of the colors R (red), G (green), and B (blue). The pixels corresponding to each color RGB have three types of EL elements corresponding to RGB, have EL elements for emitting white color light and three types of color filters for RGB, or EL elements for emitting blue color or blue-green color light and a fluorescing body (fluorescing color conversion layer, CCM).

Each color of RGB light emitted from the pixels corresponding to each of the RGB colors is irradiated to the subject in order. Then each of the RGE colors of light reflected by the subject is irradiated to the photodiodes of the pixels, and image signals corresponding to each of the RGB colors are taken into the area sensor.

Figure 4:
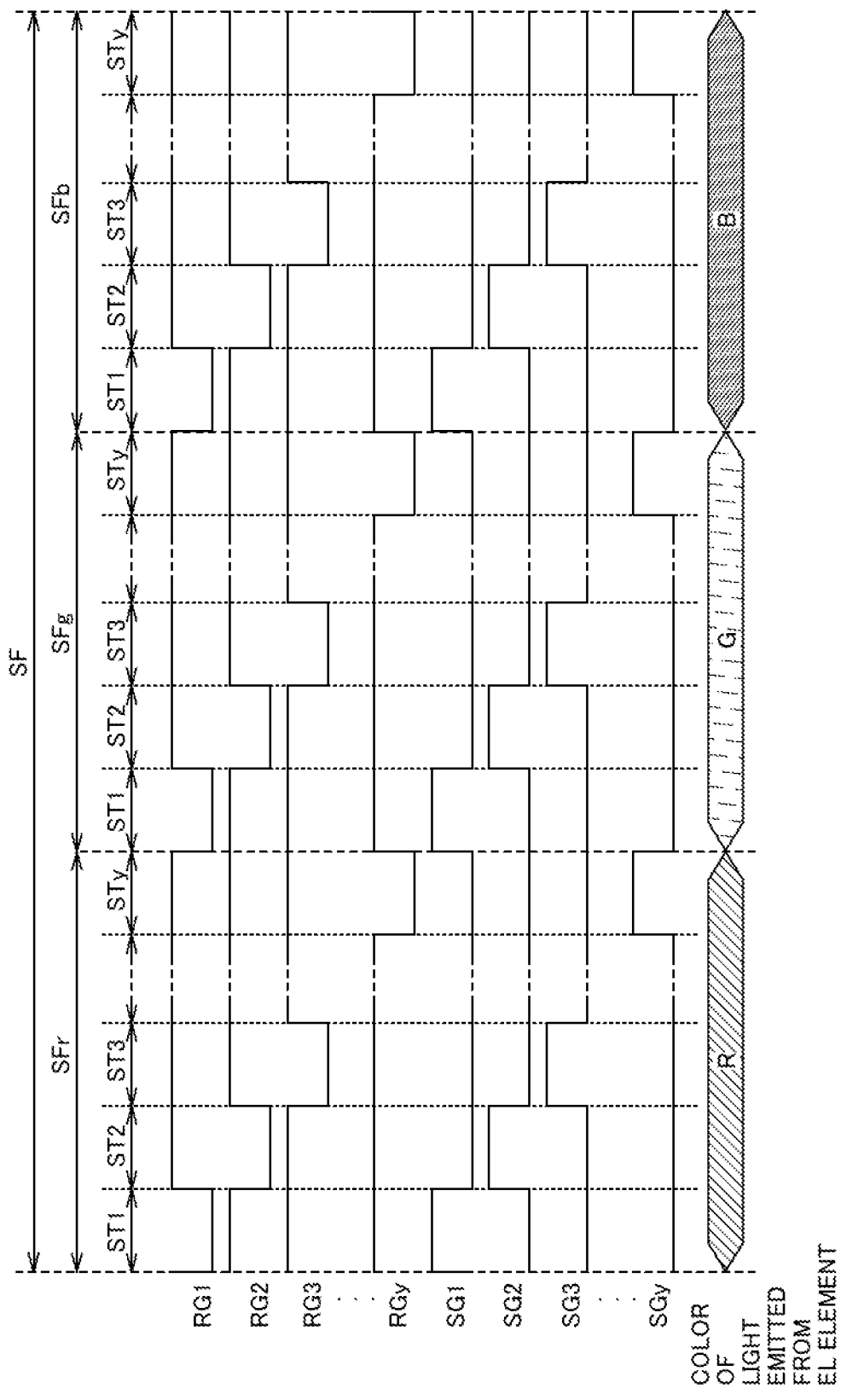
FIG. 4 is a timing chart of read in of a color image to a sensor portion.

FIG. 4 is a timing chart showing the operation of the reset TFT 110, the buffer TFT 111, and the selection TFT 112 of an area sensor for reading in a color image. Note that the timing chart shows a case in which the reset TFT 110 is an n-channel TFT, the buffer TFT 111 is a p-channel TFT, and the selection TFT 112 is an n-channel TFT.

All of the sample periods ST1 to STy appear within a period during which the EL elements of pixels corresponding to R emit light. A period up through the appearance of all of the sampling periods ST1 to STy within the period in which the EL elements of the pixels corresponding to R emit light is referred to as an R sensor frame period SFr. Image signals corresponding to R are taken into the area sensor in the R sensor frame period SFr. Note that pixels corresponding to G and B do not perform light emission during the R sensor frame period SFr.

Next, all of the sample periods ST1 to STy appear within a period during which the EL elements of pixels corresponding to G emit light. A period up through the appearance of all of the sampling periods ST1 to STy within the period in which the EL elements of the pixels corresponding to G emit light is referred to as an G sensor frame period SFg. Image signals corresponding to G are taken into the area sensor in the G sensor frame period SFg. Note that pixels corresponding to R and B do not perform light emission during the G sensor frame period SFg.

Next, all of the sample periods ST1 to STy appear within a period during which the EL elements of pixels corresponding to B emit light. A period up through the appearance of all of the sampling periods ST1 to STy within the period in which the EL elements of the pixels corresponding to B emit light is referred to as an B sensor frame period SFb. Image signals corresponding to B are taken into the area sensor in the B sensor frame period SFb. Note that pixels corresponding to R and G do not perform light emission during the B sensor frame period SFb.

A period until all of the R sensor frame period SFr, the G sensor frame period SFg, and the B sensor frame period SFb appear is referred to as the sensor frame period SF. When the sensor frame period SF is completed, one color image can be read in as an image signal.

Further, it is necessary for the EL elements of pixels corresponding to each color to always emit light in each sampling period. For example, in the sampling period ST1 within the B sensor frame period, it is necessary for the EL elements of pixels corresponding to B, from the first line of pixels, to always emit light. Furthermore, the pixels corresponding to each color may always emit light in the respective R. G, and B sensor frame periods SFr, SFg, and SFb.

Light is irradiated uniformly onto the subject in accordance with the above structure of the present invention, and therefore irregularities in the brightness of the read in image do not develop. It is not necessary to form the backlight and the light scattering plate separately from the sensor substrate, and therefore it is not necessary to precisely position the backlight, the light scattering plate, the sensor substrate, and the subject. The area sensor itself can thus be made smaller, thinner, and lighter. Further, the mechanical strength of the area sensor itself increases.

Furthermore, it is possible to display an image in a sensor portion using an EL element with the area sensor of the present invention. Therefore, without forming an electronic display in the area sensor, an image read in by the sensor portion can be displayed in the sensor portion, and the read in image can be confirmed at that spot.

Embodiments

Embodiments of the present invention are explained below.
Embodiment 1

A method of driving the switching TFT 104 and the EL driver TFT 105, which control the operation of the EL element 106 shown in FIG. 2, is explained in Embodiment 1. Note that the structure of the sensor portion is the same as that of the embodiment mode, and therefore FIG. 1 and FIG. 2 are referenced.

Figure 5:
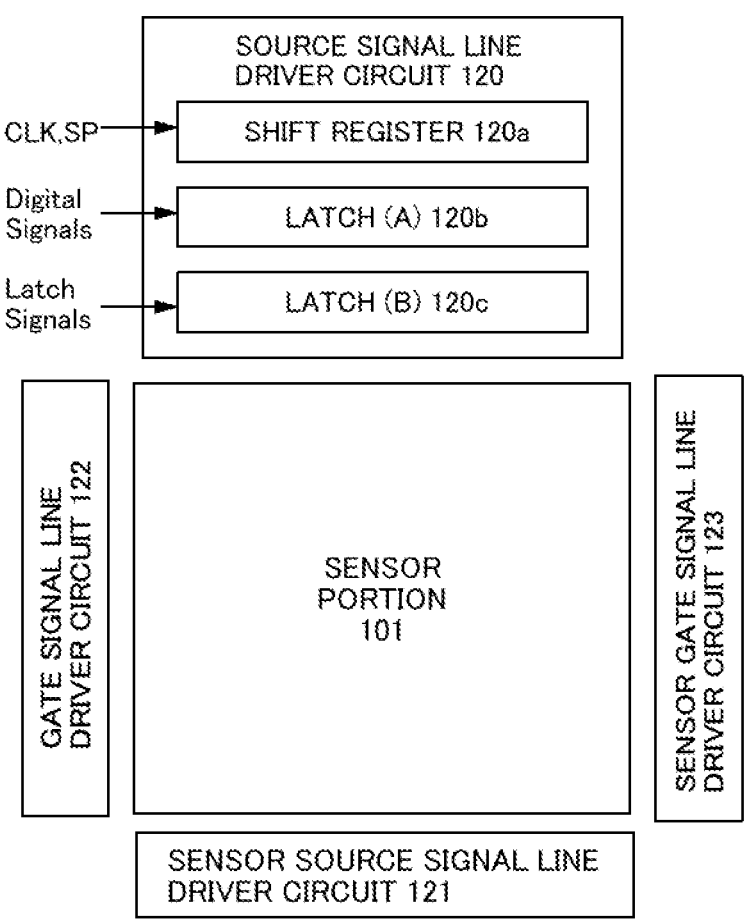
FIG. 5 is a top view of a digital drive area sensor.

FIG. 5 shows a top view of an area sensor of Embodiment 1. Reference numeral 120 denotes a source signal line driver circuit, reference numeral 122 denotes a gate signal line driver circuit, and both control the driving of the switching TFT 104 and the EL driver TFT 105. Further, reference numeral 121 denotes a sensor source signal line driver circuit, reference numeral 123 denotes a sensor gate signal line driver circuit, and both control the driving of the reset TFT 110, the buffer TFT 111, and the selection TFT 112. Note that the source signal line driver circuit 120, the gate signal line driver circuit 122, the sensor source signal line driver circuit 121, and the sensor gate signal line driver circuit 123 are referred to as a driver portion.

The source signal line driver circuit 120 has a shift register 120a, a latch (A) 120b, and a latch (B) 120c. A clock signal (CLX) and a start pulse (SP) are inputted to the shift register 120a in the source signal line driver circuit 120. The shift register 120a generates timing signals in order based upon the clock signal (CLX) and the start pulse (SP), and the timing signals are supplied one after another to downstream circuits.

Note that the timing signals from the shift register 120a may be buffer-amplified by a circuit such as a buffer (not shown in the figure) and then supplied one after another to the downstream circuits as the buffer-amplified timing signals. The load capacitance (parasitic capacitance) of a wiring to which the timing signals are supplied is large because many of the circuits and elements are connected to the wiring. The buffer is formed in order to prevent dullness in the rise and fall of the timing signal, generated due to the large load capacitance.

The timing signals from the shift register 120a are supplied to the latch (A) 120b. The latch (A) 120b has a plurality of latch stages for processing a digital signal. The latch (A) 120b writes in and maintains digital signals in order simultaneously with the input of the timing signals.

Note that the digital signals may be sequentially inputted to the plurality of latch stages of the latch (A) 120b when the digital signals are taken in by the latch (A) 120b. However, the present invention is not limited to this structure. A so-called division drive may be performed, that is, the plurality of latch stages of the latch (A) 120b is divided into a number of groups, and then the digital signals are parallely inputted to the respective groups at the same time. Note that the number of groups at this point is called a division number. For example, if the latch circuits are grouped into 4 stages each, then it is called a 4-branch division drive.

The time necessary to complete writing of the digital signals into all the latch stages of the latch (A) 120b is called a line period. In other words, the line period is defined as a time interval from the start of writing the digital data signals into the latch circuit of the leftmost stage to the end of writing the digital signals into the latch of the mostright stage in the latch (A) 120b. In effect, the above-defined line period added with the horizontal retrace period may also be referred to as the line period.

After the completion of one line period, a latch signal is supplied to the latch (B) 120c. In this moment, the digital signals written in and held by the latch (A) 120b are sent all at once to the latch (B) 120c to be written in and held by all the latch stages thereof.

Sequential writing-in of digital signals on the basis of the timing signals from the shift register 120a is again carried out to the latch (A) 120b after it has completed sending the digital signals to the latch (B) 120c.

During this second time one line period, the digital signals written in and held by the latch (B) 120c are inputted to the source signal lines S1 to Sx.

On the other hand, the gate signal line driver circuit 122 is composed of a shift register and a buffer (both not shown in the figure). Depending on the situation, the gate signal line driver circuit 122 may have a level shifter in addition to the shift register and the buffer.

In the gate signal line driver circuit 122, the gate signal is supplied to the buffer (not shown in the figure) from the shift register (also not shown in the figure), and this is supplied to a corresponding gate signal line. Gate electrodes of the switching TFTs 104 of one line portion of pixels are connected to each of the gate signal lines G1 to Gy. All of the switching TFTs 104 of the one line portion of pixels must be placed in an ON state simultaneously, and therefore a buffer in which a large electric current can flow is used.

Note that the number of source signal line driver circuits and gate signal line driver circuits, their structure, and their operation are not limited to the structure shown by Embodiment 1. The area sensor of the present invention is capable of using a known source signal line driver circuit and a known gate signal line driver circuit.

Figure 6:
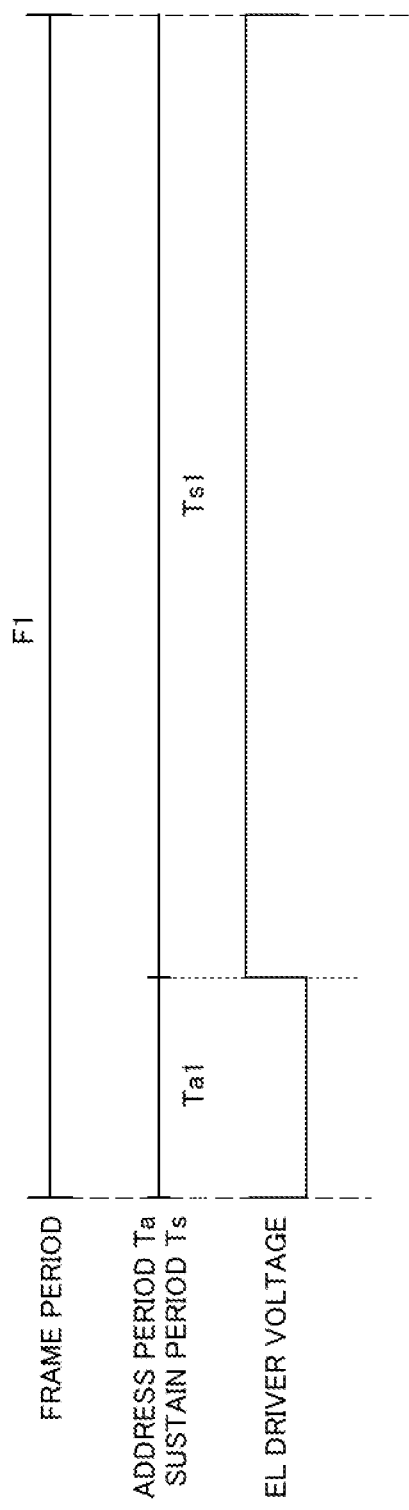
FIG. 6 is a timing chart of light emission by an EL element when reading in an image.

Next, a timing chart for a case of driving the switching TFT 104 and the EL driver TFT 105 of the sensor portion by a digital method is shown in FIG. 6.

A period through which all of the pixels of the sensor portion 101 emit light is referred to as one frame period F. The frame period is divided into an address period Ta and a sustain period Ts. The address period is a period in which a digital signal is inputted to all of the pixels during one frame period. The sustain period (also referred to as a turn-on period) denotes a period in which the EL elements emit light or not in accordance with the digital signal inputted to the pixels in the address period and display is performed.

The electric potential of the electric power source supply lines V1 to Vx is maintained at a predetermined electric potential (electric power source potential).

First, in the address period Ta, the electric potential of the opposing electrode of the EL element 106 is maintained at the same height as the electric power source potential.

Then all of the switching TFTs 104 connected to the gate signal line G1 turn on in accordance with a gate signal inputted to the gate signal line G1. A digital signal is next inputted from the source signal line driver circuit 120 to the source signal lines S1 to Sx. The digital signal inputted to the source signal lines S1 to Sx is inputted to the gate electrodes of the EL driver TFTs 105 through the switching TFTs 104 which are in an ON state.

Next, all of the switching TFTs 104 connected to the gate signal line G2 are placed in an ON state in accordance with a gate signal inputted to the gate signal line G2. The digital signal is then inputted from the source signal line driver circuit 120 to the source signal lines S1 to Sx. The digital signal inputted to the source signal lines S1 to Sx is inputted to the gate electrodes of the EL driver TFTs 105 through the switching TFTs 104 which are in an ON state.

The above operations are repeated through the gate signal line Gy, the digital signal is inputted to the gate electrodes of the EL driver TFTs 105 of all the pixels 102, and the address period is completed.

The sustain period begins simultaneously to the end of the address period Ta. All of the switching TFTs 104 are placed in an OFF state in the sustain period.

Then, at the same time as the sustain period begins, the electric potential of the opposing electrodes of all the EL elements has a height of the electric potential difference between the electric power source potential to the level at which the EL elements will emit light when the electric potential of the electric power source is applied to the pixel electrodes. Note that the electric potential difference between the pixel electrode and the opposing electrode is referred to as an EL driver voltage in this specification. Further, the EL driver TFTs 105 are placed in an ON state in accordance with the digital signal inputted to the gate electrode of the EL driver TFTs 105 of each pixel. Therefore, the electric power source potential is applied to the pixel electrodes of the EL elements, and the EL elements of all pixels emit light.

One frame period is completed at the same time as the sustain period is completed. It is necessary that the pixels emit light in all of the sampling periods ST1 to STy with the present invention. Therefore, it is very important that the sensor frame period SF be included within the sustain period when using the digital driving method of Embodiment 1.

Note that an explanation of a method of driving the area sensor for reading in a single color image is explained in Embodiment 1, but a case of reading in a color image is similar. However, for the case of an area sensor which reads in a color image, one frame period is divided into three subframe periods corresponding to RGB, and an address period and a sustain period are formed in each subframe period. A digital signal is inputted to all of the pixels such that only the EL elements of pixels corresponding to R will emit light, and only the EL elements for the color R perform light emission in the sustain period. The subframe periods for G and B are similar, and only EL elements of pixels corresponding to the respective colors perform light emission in each sustain period.

For the case of an area sensor which reads in a color image, it is important that each sustain period of the three subframe periods corresponding to RGB contains a sensor frame period for R, G, and B (SFr, SFg, SFb), respectively.

Embodiment 2

A method of driving the switching TFT 104 and the EL driver TFT 105 when displaying an image in the sensor portion 101 is explained in Embodiment 2. Note that the structure of the sensor portion is the same as the structure shown by the embodiment mode, and therefore FIG. 1 and FIG. 2 may be referenced.

Figure 7:
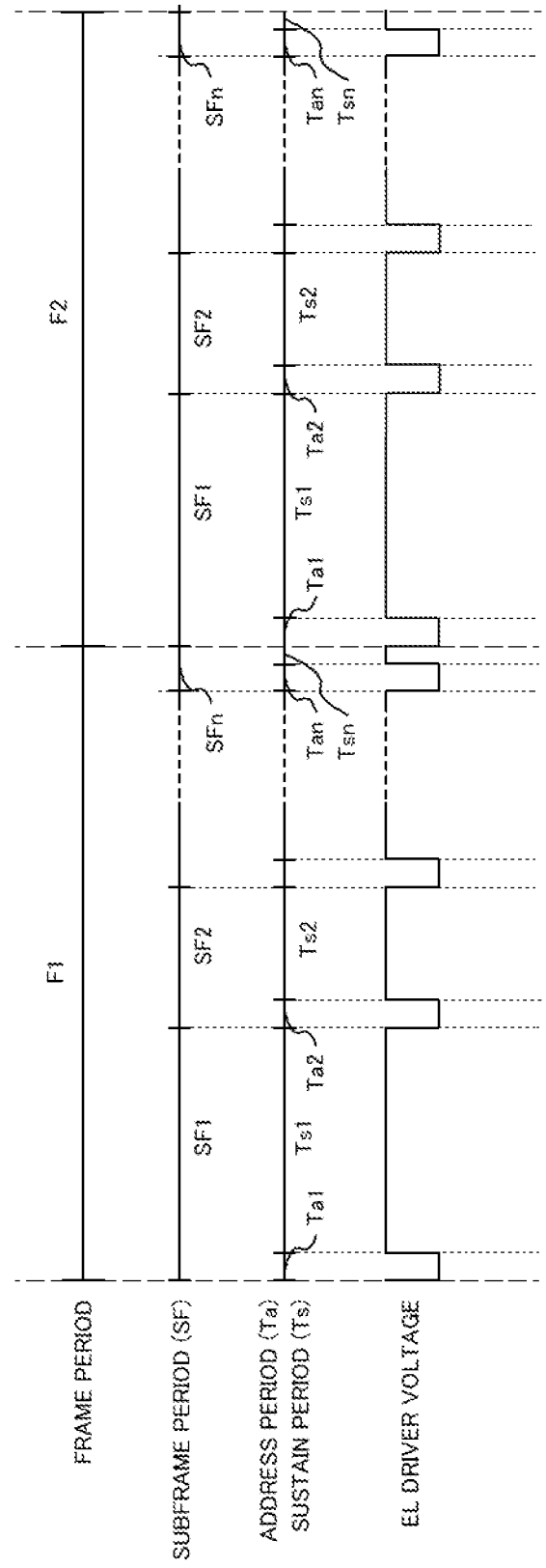
FIG. 7 is a timing chart of light emission by an EL element when displaying an image.

A timing chart when performing display of an image in the sensor portion 101 in the area sensor of the present invention by a digital method is shown in FIG. 7.

First, one frame period F is divided into n subframe periods SF1 to SFn. The number of subframe periods in one frame period also increases as the number of gray scales increases. Note that, when the sensor portion of the area sensor displays an image, one frame period F denotes a period during which all pixels of the sensor portion display one image.

It is preferable that 60 or more frame periods be provided each second for the case of Embodiment 2. By setting the number of images displayed each second to 60 or greater, it becomes possible to visually suppress image flicker.

The subframe period is divided into an address period Ta and a sustain period Ts. The address period is a period within one subframe period during which a digital video signal is inputted to all pixels. Note that the digital video signal is a digital signal having image information. The sustain period (also referred to as a turn-on period) denotes a period during which EL elements are placed in a state of emitting light or not emitting light in accordance with the digital video signal, inputted to the pixels in the address period and display is performed. Note that the digital video signal denotes the digital signal having image information.

The address periods Ta of SF1 to SFn are taken as address periods Ta1 to Tan, and the sustain periods Ts of SF1 to SFn are taken as sustain periods Ts1 to Tsn.

The electric potential of the electric power source supply lines V1 to Vx is maintained at a predetermined electric potential (electric power source potential).

First, the electric potential of the opposing electrode of the EL elements 106 is maintained at the same height as the electric power source potential in the address period Ta.

Next, all of the switching TFTs 104 connected to the gate signal line G1 are placed in an ON state in accordance with a gate signal inputted to the gate signal line G1. The digital video signal is then inputted to the source signal lines S1 to Sx from the source signal line driver circuit 102. The digital video signal has "0" or "1" information, and one of the "0" and "1" digital video signals is a signal having a "HI" voltage, while the other is a signal having a "LO" voltage.

The digital video signal inputted to the source signal lines S1 to Sx is then inputted to the gate electrodes of the EL driver TFTs 105 through the switching TFTs 104 in an ON state.

All of the switching TFTs 104 connected to the gate signal line G1 are then placed in an OFF state, and all of the switching TFTs 104 connected to the gate signal line G2 are placed in an ON state in accordance with a gate signal inputted to the gate signal line G2. The digital video signal is then inputted to the source signal lines S1 to Sx from the source signal line driver circuit 102. The digital video signal inputted to the source signal lines S1 to Sx is inputted to the gate electrodes of the EL driver TFTs 105 through the switching TFTs 104 in an ON state.

The above operations are repeated through the gate signal line Gy, and the digital video signal is inputted to the gate electrodes of the EL driver TFTs 105 of all the pixels 102, and the address period is completed.

The sustain period Ts begins simultaneously with the completion of the address period Ta. All of the switching TFTs 104 are in an OFF state in the sustain period. The electric potential of the opposing electrodes of all the EL elements has a height of the electric potential difference between the electric power source potential to the level at which the EL elements will emit light when the electric potential of the electric power source is applied to the pixel electrodes.

When the digital video signal has "0" information, the EL driver TFT 105 is placed in an OFF state in. Embodiment 2. The pixel electrode of the EL elements is therefore maintained at the electric potential of the opposing electrode. As a result, the EL element 106 does not emit light when the digital video signal having "0" information is inputted to the pixel.

On the other hand, when the digital video signal has "1" information, the EL driver TFTs are placed in an ON state. The electric power source potential is therefore applied to the pixel electrode of the EL element 106. As a result, the EL element 106 of the pixel into which the digital video signal having "1" information is inputted emits light.

The EL elements are thus placed in a state in which they emit light or do not emit light in accordance with the information of the digital video signal input to the pixels, and the pixels perform display.

One subframe period is complete at the same time as the sustain period is complete. The next subframe period then appears, and once again the address period begins. The sustain period again beings after the digital video signal is input to all of the pixels. Note that the order of appearance of the subframe periods SF1 to SFn is arbitrary.

Similar operations are then repeated in the remaining subframe periods, and display is performed. After completing all of the n subframe periods, one image is displayed, and one frame period is completed. When one frame period is complete, the subframe period of the next frame period appears, and the above stated operations are repeated.

The lengths of the address periods Ta1 to Tan of the respective n subframe periods are each the same in the present invention. Further, the ratio of lengths of the n sustain periods Ts1, . . . , Tsn is expressed as Ts1:Ts2:Ts3: . . . : Ts(n−1): Tsn=$2^0:2^{-1}:2^{-2}: \ldots :2^{-(n-2)}$.

The gray-scale of each pixel is determined in accordance with during which subframe periods in one frame period the pixel is made to emit light. For example, when n=8, and taking the brightness of pixels which emit light in all of the sustain periods as having a value of 100%, pixels which emit light in Ts1 and Ts2 can express a brightness of 75%, and for a case of selecting Ts3, Ts5, and Ts8, a brightness of 16% can be expressed.

Note that it is possible to freely combine Embodiment 2 with Embodiment 1.

Embodiment 3

The electric potential of the opposing electrodes are maintained at the same electric potential as that of the electric power source potential during the address period in Embodiments 1 and 2. Therefore, the EL elements do not emit light. However, the present invention is not limited to this structure. If an electric potential difference is always formed between the opposing electric potential and the electric power source potential, on an order at which the EL elements will emit light, when the electric power source potential is applied to the pixel electrodes, display may also be performed in the address period, similar to the display period.

However, when combining Embodiment 1, in which the EL elements are used as the light source of the area sensor, with Embodiment 3, it is important that the sensor frame period SF be contained within the frame period for an area sensor which reads in a single color image. Furthermore, it is important that the three subframe periods corresponding to RGB be contained in R, G, and B sensor frame periods, respectively, for an area sensor which reads in a color image.

In addition, when combining Embodiment 2, in which an image is displayed in the sensor portion, with Embodiment 3, the entire subframe period in practice becomes a period for performing display, and therefore the lengths of the subframe periods are set so as to be SF1:SF2:SF3: . . . :SF(n−1): SFn=$2^0: 2^{-1}: 2^{-2}: \ldots :2^{-(n-1)}$. An image having a high brightness can be obtained in accordance with the above structure when compared with the drive method in which light is not emitted during the address period.

Embodiment 4

An example of a method of driving the switching TFTs 104 and the EL driver TFTs 105, which control the operation of the EL elements 106 shown in FIG. 2, by a method which differs from that of Embodiment 1 is explained in Embodiment 4. Note that the structure of the sensor portion is the same as that shown by the embodiment mode, and therefore FIG. 1 and FIG. 2 may be referenced.

Figure 8:
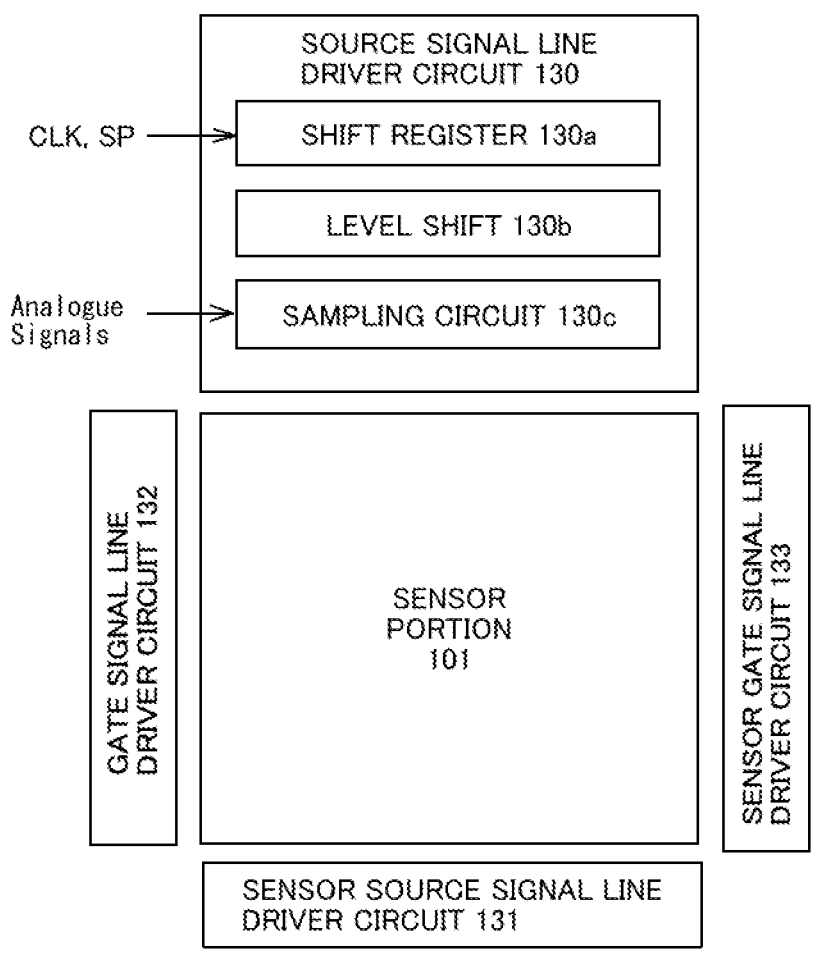
FIG. 8 is a top view of an analog drive area sensor.

A top view of an area sensor of Embodiment 4 is shown in FIG. 8. Reference numeral 130 denotes a source signal line driver circuit, reference numeral 132 denotes a gate signal line driver circuit, and both control the driving of, the switching TFT 104 and the EL driver TFT 105. Further, reference numeral 131 denotes a sensor source signal line driver circuit, and reference numeral 133 denotes a sensor gate signal line driver circuit, and both control the driving of the reset TFT 110, the buffer TFT 111, and the selection TFT 112. One each of the source signal line driver circuit and the gate signal line driver circuit are formed in Embodiment 4, but the present invention is not limited to this structure. Two source signal line driver circuits may also be formed. Further, two gate signal line driver circuits may also be formed.

Note that the source signal line driver circuit 130, the gate signal line driver circuit 132, the sensor source signal line driver circuit 131, and the sensor gate signal line driver circuit 133 are referred to as a driver portion throughout this specification.

The source signal line driver circuit 130 has a shift register 130a, a level shifter 130, and a sampling circuit 130c. Note that the level shifter may be used when necessary, and it need not necessarily be used. Further, a structure is used in Embodiment 4 in which the level shifter is formed between the shift register 130a and the sampling circuit 130c, but the present invention is not limited to this structure. A structure in which the level shifter 130b is incorporated within the shift register 130a may also be used.

A clock signal CLK and a start pulse signal SP are input to the shift register 130a in the source signal line driver circuit 130. A sampling signal is output from the shift register 130a in order to sample an analog signal. The output sampling signal is input to the level shifter 130b, and it electric potential amplitude is increased, and it is output.

The sampling signal output from the level shifter 130b is input to the sampling circuit 130c. The analog signal input to the sampling circuit 130c is then sampled by the sampling signal, and input to source signal lines S1 to Sx.

On the other hand, the gate signal line driver circuit 132 has a shift register and a buffer (neither shown in the figure). Further, the gate signal line driver circuit 132 may also have a level shifter in addition to the shift register and the buffer, depending upon the circumstances.

In the gate signal line driver circuit 132, a gate signal is supplied to the buffer (not shown in the figure) from the shift register (also not shown in the figure), and this is supplied to a corresponding gate signal line. Gate electrodes of the switching TFTs 104 of one line portion of pixels are connected to the gate signal lines G1 to Gy, and all of the switching TFTs 104 of the one line portion of pixels must be placed in an ON state simultaneously, and therefore a buffer in which a large electric current is capable of flowing is used.

Note that the number of source signal line driver circuits and gate signal line driver circuits, their structure, and their operation are not limited to the structure shown by Embodiment 4. The area sensor of the present invention is capable of using a known source signal line driver circuit and a known gate signal line driver circuit.

Figure 9:
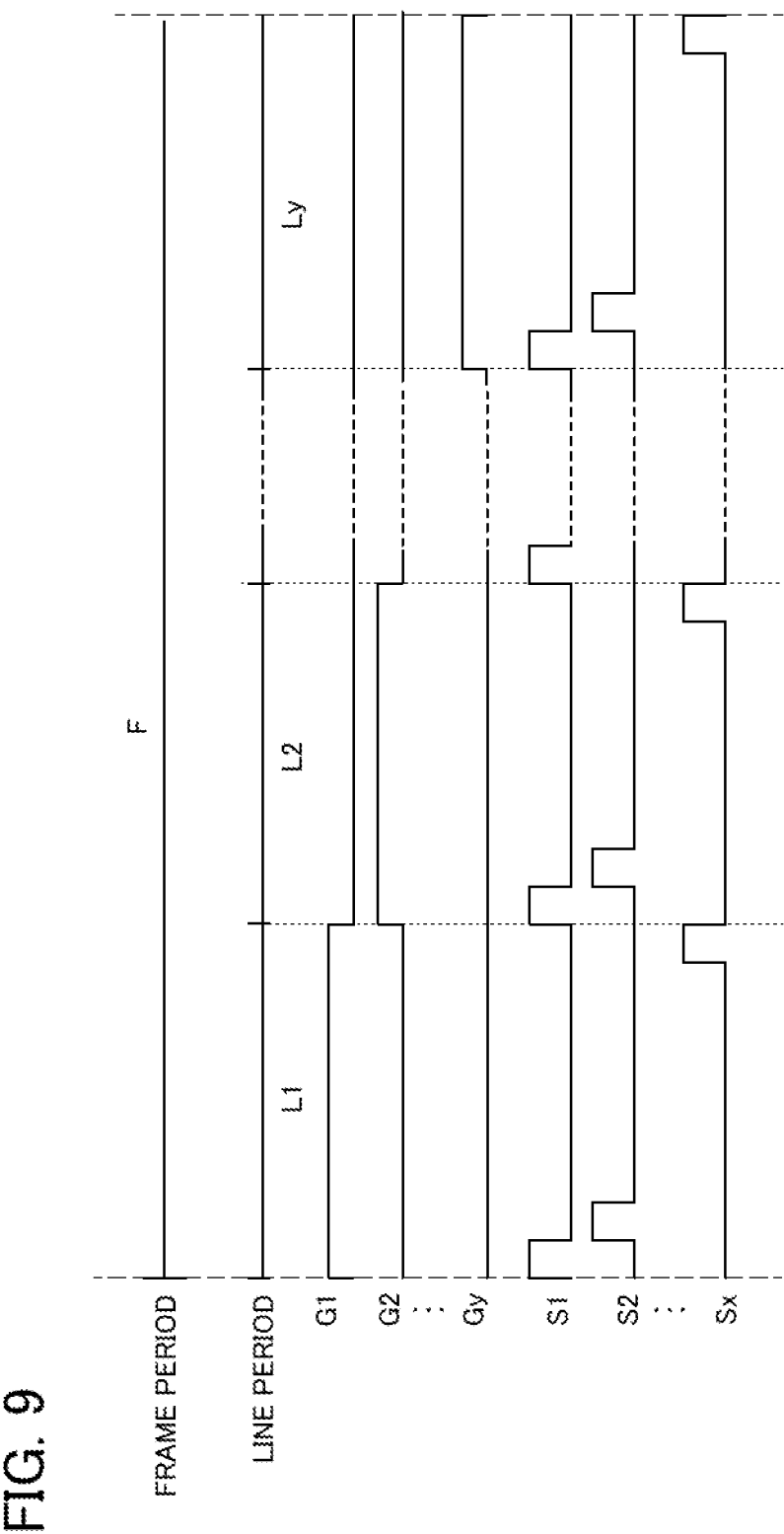
FIG. 9 is a timing chart of light emission by an EL element when reading in an image.

Next, a timing chart for a case of driving the switching TFT 104 and the EL driver TFT 105 of the sensor portion by an analog method is shown in FIG. 9. A period through which all of the pixels of the sensor portion display light is referred to as one frame period F. One line period L denotes a period from the selection of one gate signal line until the selection of the next, separate, gate signal line. For the case of the area sensor shown in FIG. 2, there are y gate signal lines, and therefore y line periods L1 to Ly are formed within one frame period.

The number of line periods within one frame period increases along with increasing resolution, and the driver circuits must be driven at a high frequency.

First, the electric potential of the electric power source supply lines V1 to Vx is maintained at the constant electric power source potential. The opposing electric potential. The electric potential of the opposing electrodes of the EL elements 106, is also maintained at a constant electric potential. The electric power source potential has an electric potential difference with the opposing electric potential on the order that the EL elements 106 will emit light when the electric power supply potential is applied to the pixel electrodes of the EL elements 106.

In the first line period L1, all of the switching TFTs 104 connected to the gate signal line G1 are placed in an ON state in accordance with a gate signal input to the gate signal line G1 from the gate signal line driver circuit 132. The analog signal is then input to the source signal lines S1 to Sx in order from the source signal line driver circuit 130. The analog signal input to the source signal lines S1 to Sx is input to the gate electrodes of the EL driver TFTs 105 through the switching TFTs 104 which are in an ON state.

The size of the electric current flowing in a channel forming region of the EL driver TFTs 105 is controlled by the height of the electric potential (voltage) of the signal input to the gate electrodes of the EL driver TFTs 105. Therefore, the electric potential applied to the pixel electrodes of the EL elements 106 is determined by the height of the electric potential of the analog signal input to the gate electrodes of the EL driver TFTs 105. The EL elements 105 are controlled by the electric potential of the analog signal, and perform the emission of light. Note that, in the case of Embodiment 4, the analog signal input to all of the pixels is maintained at an electric potential having the same height.

The first line period L1 is complete when input of the analog signal to the source signal lines S1 to Sx is completed. Note that the period until the input of the analog signal to the source signal lines S1 to Sx is complete may also be combined with a horizontal return period and taken as one line period. The second line period L2 begins next, and all of the switching TFTs 104 connected to the gate signal line G1 are placed in an OFF state. All of the switching TFTs 104 connected to the gate signal line G2 are then placed in an ON state in accordance with a gate signal input to the gate signal line G2. Then, similar to the first line period L1, the analog signal is input in order to the source signal lines S1 to Sx.

The above operations are repeated up through the gate signal line Gy, and all of the line periods L1 to Ly are complete. When all of the line periods L1 to Ly are completed, one frame period is complete. The EL elements of all of the pixels perform light emission by completing one frame period. Note that all of the line periods L1 to Ly and a vertical return period may also be combined and taken as one frame period.

It is necessary for the pixels to emit light in all of the sampling periods ST1 to STy with the present invention, and for the case of the driving method of Embodiment 4, it is important that the sensor frame period SF is included within the frame period.

Note that an explanation of a method of driving an area sensor for reading in a single color image is explained in Embodiment 4, but a case of reading in a color image is similar. However, for an area sensor which reads in a color image, one frame period is divided into three subframe periods corresponding to RGB. An analog signal is then input to all of the pixels such that only the EL elements of pixels corresponding to R will emit light in an R subframe period, and only the EL elements for the color R perform light emission. The subframe periods for G and B are similar, and only EL elements of pixels corresponding to the respective color perform light emission.

For the case of an area sensor which reads in a color image, it is important that each sustain period of the three subframe periods corresponding to RGB contain a sensor frame period for R, G, and B (SFr, SFg, SFb), respectively.

Note that if an analog video signal having image information is substituted for the analog signal for a case of displaying an image in the sensor portion 101 in the driving method of Embodiment 4, display of the image in the sensor portion 101 becomes possible.

Embodiment 5

A cross sectional diagram of an area sensor of the present invention is explained in Embodiment 5.

Figure 10:
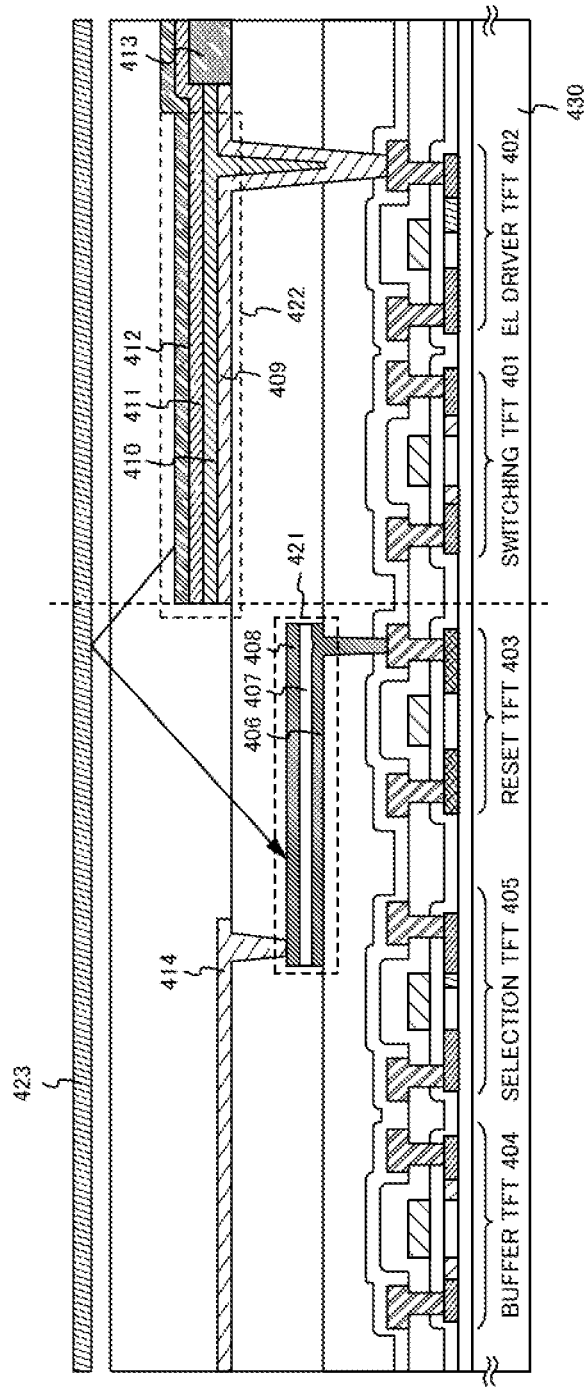
FIG. 10 is a cross sectional diagram of a sensor portion.

FIG. 10 shows a cross sectional diagram of an area sensor of Embodiment 5. Reference numeral 401 denotes a switching TFT, reference numeral 402 denotes an EL driver TFT, 403 denotes a reset TFT, 404 denotes a buffer TFT, and reference numeral 405 denotes a selection TFT.

Further, reference numeral 406 denotes a cathode, 407 denotes a photoelectric conversion layer, and reference numeral 408 denotes an anode. A photodiode 421 is formed by the cathode 406, the photoelectric conversion layer 407, and the anode 408. Reference numeral 414 denotes a sensor wiring, and the sensor wiring is connects the anode 408 and an external electric power source.

Further, reference numeral 409 denotes a pixel electrode (cathode), 410 denotes a light emitting layer, 411 denotes a hole injecting layer, and 412 denotes an opposing electrode (anode). An EL element 422 is formed by the pixel electrode (cathode) 409 the light emitting layer 410 the hole injecting layer 411, and the opposing electrode (anode) 412. Note that reference numeral 413 denotes a bank, and that the light emitting layers 410 of adjacent pixels are separated.

Reference numeral 423 denotes a subject, and light emitted from the EL element 422 is reflected by the subject 423 and is irradiated to the photodiode 421. The subject 423 is formed on the side of a sensor substrate 430 on which the TFTs are formed in Embodiment 5.

The switching TFT 401, the EL driver TFT 402, the buffer TFT 404, and the selection TFT 405 are all n-channel TFTs in Embodiment 5. Further, the reset TFT 403 is a p-channel TFT. Note that the present invention is not limited to this structure. Therefore, the switching TFT 401, the EL driver TFT 402, the buffer TFT 404, the selection TFT 405, and the reset TFT 403 may be either n-channel TFTs or p-channel TFTs.

However, when a source region or a drain region of the EL driver TFT 402 is electrically connected to the cathode of the EL element, as in Embodiment 5, it is preferable that the EL driver TFT 402 be an n-channel TFT. Conversely, when the source region or the drain region of the EL driver TFT 402 is electrically connected to the anode of the EL element it is preferable that the EL driver TFT 402 be a p-channel TFT.

Furthermore, when the a drain region of the reset TFT 403 is electrically connected to the cathode 406 of the photodiode 421, as in Embodiment 5, it is preferable that the reset TFT 403 be a p-channel. TFT, and that the buffer TFT 404 be an n-channel TFT. Conversely, when the drain region of the reset TFT 403 is electrically connected to the anode electrode 408 of the photodiode 421, and the sensor wiring 414 is connected to the cathode electrode 406, it is preferable that the reset TFT 403 be an n-channel TFT, and that the buffer TFT 404 be a p-channel TFT.

Note that it is possible to freely combine Embodiment 5 with Embodiments 1 to 4.

Embodiment 6

A cross sectional diagram of an area sensor of the present invention, differing from that of Embodiment 5, is explained in Embodiment 6.

Figure 11:
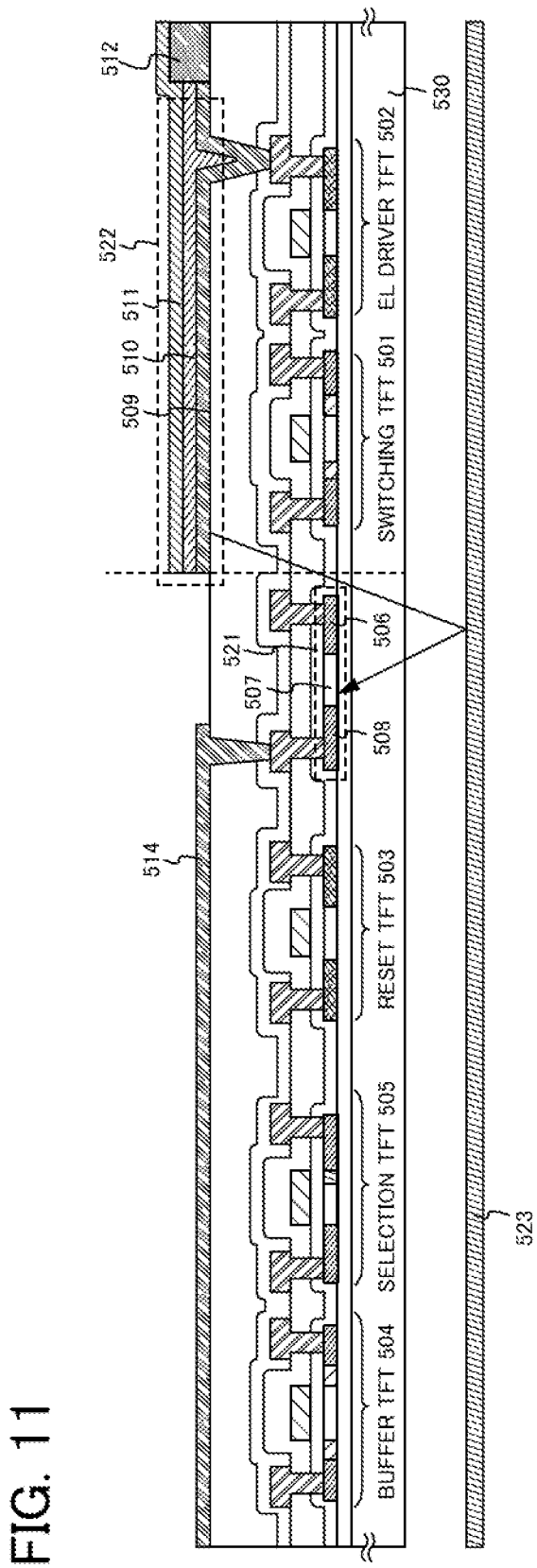
FIG. 11 is a cross sectional diagram of a sensor portion.

FIG. 11 shows a cross sectional diagram of an area sensor of Embodiment 6. Reference numeral 501 denotes a switching TFT, reference numeral 502 denotes an EL driver TFT, 503 denotes a reset TFT, 504 denotes a buffer TFT, and reference numeral 505 denotes a selection TFT.

Further, reference numeral 506 denotes a cathode electrode. 507 denotes a photoelectric conversion layer, and reference numeral 508 denotes an anode electrode. A photodiode 521 is formed by the cathode electrode 506, the photoelectric conversion layer 507, and the anode electrode 508. Reference numeral 514 denotes a sensor wiring, and the sensor wiring electrically connects the anode electrode 508 and an external electric power source. Further, the cathode electrode 506 of the photodiode 521 and a drain region of the reset TFT 503 are electrically connected.

Reference numeral 509 denotes a pixel electrode (anode), 510 denotes an EL layer, and 511 denotes an opposing electrode (cathode). An EL element 522 is formed by the pixel electrode (anode) 509, the EL layer 510, and the opposing electrode (cathode) 511. Note that reference numeral 512 denotes a bank, and that the EL layers 510 of adjacent pixels are separated.

Reference numeral 523 denotes a subject, and light emitted from the EL element 522 is reflected by the subject 523 and is irradiated to the photodiode 521. Differing from Embodiment 5, the subject 523 is formed on the side of a sensor substrate 530 on which the TFTs are not formed in Embodiment 6.

The switching TFT 501, the buffer TFT 504, and the selection TFT 505 are all n-channel TFTs in Embodiment 6. Further, the EL driver TFT 502 and the reset TFT 503 are p-channel TFTs. Note that the present invention is not limited to this structure. Therefore, the switching TFT 501, the EL driver TFT 502, the buffer TFT 504, the selection TFT 505, and the reset TFT 503 may be either n-channel TFTs or p-channel TFTs.

However, when a source region or a drain region of the EL driver TFT 502 is electrically connected to the anode 509 of the EL element 522, as in Embodiment 6, it is preferable that the EL driver TFT 502 be a p-channel TFT. Conversely, when the source region or the drain region of the EL driver TFT 502 is electrically connected to the cathode of the EL element 522, it is preferable that the EL driver TFT 502 be an n-channel TFT.

Furthermore, when the drain region of the reset TFT 503 is electrically connected to the cathode electrode 506 of the photodiode 521, as in Embodiment 6, it is preferable that the reset TFT 503 be a p-channel TFT, and that the buffer TFT 504 be an n-channel TFT. Conversely, when the drain region of the reset TFT 503 is electrically connected to the anode electrode 508 of the photodiode 521, and the sensor wiring 514 is connected to the cathode electrode 506, it is preferable that the reset TFT 503 be an n-channel TFT, and that the buffer TFT 504 be a p-channel ITT.

Note the photodiode and the other TFTs of Embodiment 6 can be formed at the same time, and therefore the number of process steps can be suppressed.

Note also that it is possible to freely combine Embodiment 6 with Embodiments 1 to 4.

Embodiment 7

A cross sectional diagram of an area sensor of the present invention, differing from that of Embodiment 5 and Embodiment 6, is explained in Embodiment 7.

Figure 12:
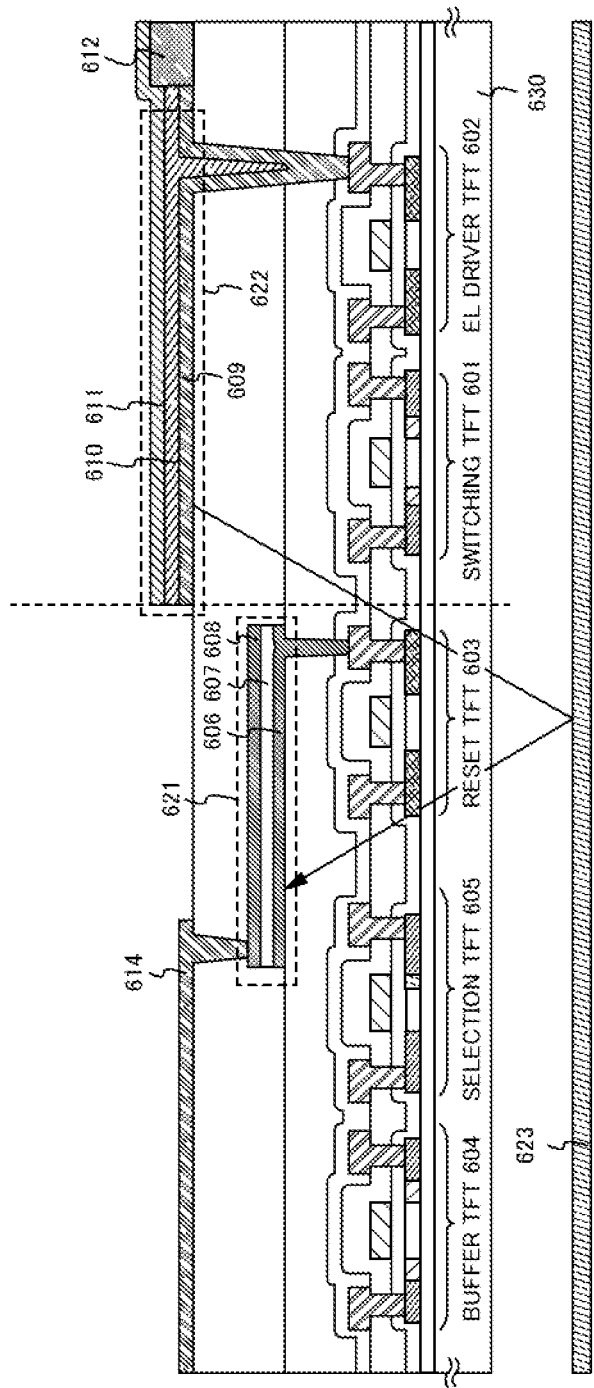
FIG. 12 is a cross sectional diagram of a sensor portion.

FIG. 12 shows a cross sectional diagram of an area sensor of Embodiment 7. Reference numeral 601 denotes a switching TFT, reference numeral 602 denotes an EL driver TFT, 603 denotes a reset TFT, 604 denotes a buffer TFT, and reference numeral 605 denotes a selection TFT.

Further, reference numeral 606 denotes a cathode electrode, 607 denotes a photoelectric conversion layer, and 608 denotes an anode electrode. A photodiode 621 is formed by the cathode electrode 606, the photoelectric conversion layer 607, and the anode electrode 608. Reference numeral 614 denotes a sensor wiring, and the sensor wiring connects the anode electrode 608 and an external electric power source. Further, the cathode electrode 606 of the photodiode 621 and a drain region of the reset TFT 603 are electrically connected.

Reference numeral 609 denotes a pixel electrode (anode), 610 denotes an EL layer, and 611 denotes an opposing electrode (cathode). An EL element 622 is formed by the pixel electrode (anode) 609, the EL layer 610, and the opposing electrode (cathode) 611. Note that reference numeral 612 denotes a hank, and that the EL layers 610 of adjacent pixels are separated.

Reference numeral 623 denotes a subject, and light emitted from the EL element 622 is reflected by the subject 623 and is irradiated to the photodiode 621. Differing from Embodiment 5, the subject 523 is formed on the side of a sensor substrate 630 on which the TFTs are not formed in Embodiment 7.

The switching TFT 601, the buffer TFT 604, and the selection TFT 605 are all n-channel TFTs in Embodiment 7. Further, the EL driver TFT 602 and the reset TFT 603 are p-channel TFTs. Note that the present invention is not limited to this structure. Therefore, the switching TFT 601, the EL driver TFT 602, the buffer TFT 604, the selection TFT 605, and the reset TFT 603 may be either n-channel TFTs or p-channel TFTs.

However, when a source region or a drain region of the EL driver TFT 602 is electrically connected to the anode of the EL element, as in Embodiment 7, it is preferable that the EL driver TFT 602 be a p-channel TFT. Conversely, when the source region or the drain region of the EL driver TFT 602 is electrically connected to the cathode of the EL element, it is preferable that the EL driver TFT 602 be an n-channel TFT.

Furthermore, when the drain region of the reset TFT 603 is electrically connected to the cathode electrode 606 of the photodiode 621, as in Embodiment 7, it is preferable that the reset TFT 603 be a p-channel TFT, and that the buffer TFT 604 be an n-channel TFT. Conversely, when the drain region of the reset TFT 603 is electrically connected to the anode electrode 608 of the photodiode 621, and the sensor wiring 614 is connected to the cathode electrode 606, it is preferable that the reset TFT 603 be an n-channel TFT, and that the buffer TFT 604 be a p-channel TFT.

Note that it is possible to freely combine Embodiment 7 with Embodiments 1 to 4.

Embodiment 8

A cross sectional diagram of an area sensor of the present invention, differing from that of Embodiments 5 to 7, is explained in Embodiment 8.

Figure 13:
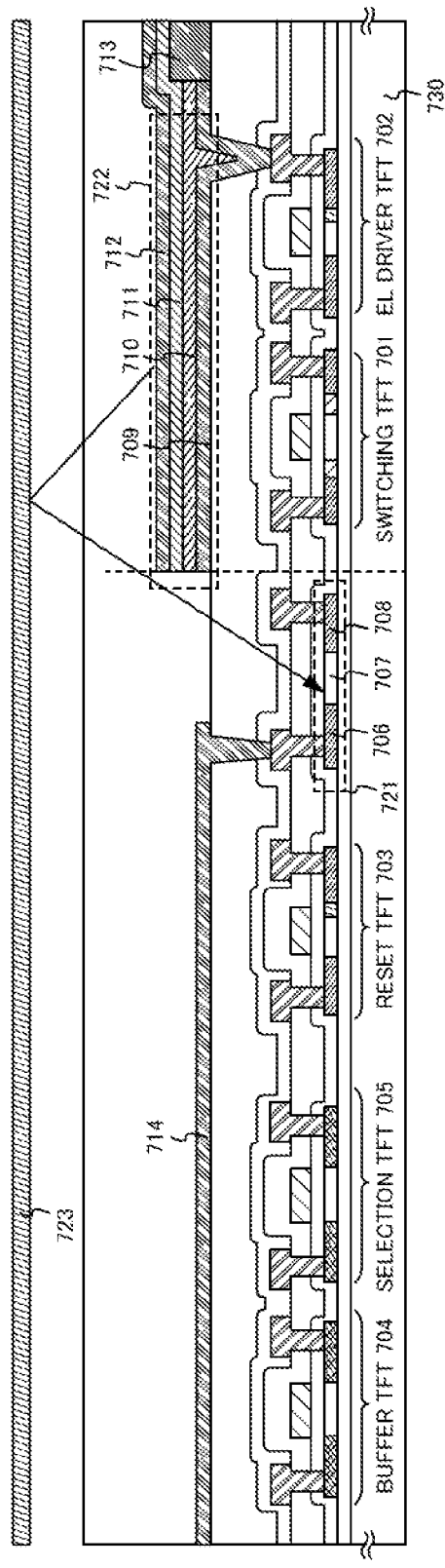
FIG. 13 is a cross sectional diagram of a sensor portion.

FIG. 13 shows a cross sectional diagram of an area sensor of Embodiment 8. Reference numeral 701 denotes a switching TFT. 702 denotes an EL driver TFT, 703 denotes a reset TFT, 704 denotes a buffer TFT, and 705 denotes a selection TFT.

Further, reference numeral 706 denotes a cathode electrode, 707 denotes a photoelectric conversion layer, and 708 denotes an anode electrode. A photodiode 721 is formed by the cathode electrode 706, the photoelectric conversion layer 707, and the anode electrode 708. Reference numeral 714 denotes a sensor wiring, and the sensor wiring connects the cathode electrode 706 and an external electric power source. Further, the anode electrode 708 of the photodiode 721 and a drain region of the reset TFT 703 are electrically connected.

Reference numeral 709 denotes a pixel electrode (cathode), 710 denotes a light emitting layer, 711 denotes a hole injecting layer and 712 denoted an opposing electrode (anode). An EL element 722 is formed by the pixel electrode (cathode) 709, the EL layer 710, the hole injecting layer 711, and the opposing electrode (anode) 712. Note that reference numeral 713 denotes a bank, and that the light emitting layers 710 of adjacent pixels are separated.

Reference numeral 723 denotes a subject, and light emitted from the EL element 722 is reflected by the subject 723 and is irradiated to the photodiode 721. The subject 723 is formed on the side of a sensor substrate 730 on which the TFTs are formed in Embodiment 8.

The switching TFT 701, the EL driver TFT 702, and the reset TFT 703 are all n-channel TFTs in Embodiment 8. Further, the buffer TFT 704 and the selection TFT 705 are p-channel TFTs. Note that the present invention is not limited to this structure. Therefore, the switching TFT 701, the EL driver TFT 702, the buffer TFT 704, the selection TFT 705, and the reset. TFT 703 may be n-channel TFTs or p-channel TFTs.

However, when a source region or a drain region of the EL driver TFT 702 is electrically connected to the cathode 709 of the EL element 722, as in Embodiment 8, it is preferable that the EL driver TFT 702 be an n-channel TFT. Conversely, when the source region or the drain region of the EL driver TFT 702 is electrically connected to the anode 712 of the EL element 722, it is preferable that the EL driver TFT 702 be a p-channel TFT.

Furthermore, when the drain region of the reset TFT 703 is connected to the anode electrode 708 of the photodiode 721, as in Embodiment 8, it is preferable that the reset TFT 703 be an n-channel TFT, and that the buffer TFT 704 be a p-channel TFT. Conversely, when the drain region of the reset TFT 703 is electrically connected to the cathode electrode 706 of the photodiode 721, and the sensor wiring 714 is connected to the anode electrode 708, it is preferable that the reset TFT 703 be a p-channel TFT, and that the buffer TFT 704 be an n-channel TFT.

Note the photodiode 721 and the other TFTs of Embodiment 8 can be formed at the same time, and therefore the number of process steps can be suppressed.

Note also that it is possible to freely combine Embodiment 8 with Embodiments 1 to 4.

Embodiment 9

A method of manufacturing a sensor portion of an area sensor of this invention is explained using FIGS. 14 to 16.

First, as shown in FIG. 14A, a base film 201 is formed to a thickness of 300 nm on a glass substrate 200. A silicon oxinitride film is laminated as the base film 201 in Embodiment 9. At this point, it is appropriate to set the nitrogen concentration to between 10 and 25 wt % in the film contacting the glass substrate 200. In addition, it is effective that the base film 201 has a thermal radiation effect, and a PLC (diamond-like carbon) film may also be provided.

Next, an amorphous silicon film (not shown in the figure) is formed with a thickness of 50 nm on the base film 201 by a known deposition method. Note that it is not necessary to limit to the amorphous silicon film, and a semiconductor film containing an amorphous structure (including a microcrystalline semiconductor film) may be used. In addition, a compound semiconductor film containing an amorphous structure, such as an amorphous silicon germanium film, may also be used. Further, the film thickness may be made from 20 to 100 nm.

The amorphous silicon film is then crystallized by a known technique, forming a crystalline silicon film (also referred to as a polycrystalline silicon film or a polysilicon film) 202. Thermal crystallization using an electric furnace, laser annealing crystallization using a laser light, and lamp annealing crystallization using an infrared light as known crystallization methods. Crystallization is, performed in Embodiment 9 using an excimer laser light, which uses XeCl gas.

Note that pulse emission excimer laser light formed into a linear shape is used in Embodiment 9, but a rectangular shape may also be used. Continuous emission type argon laser light and continuous emission type excimer laser light can also be used.

In this embodiment, although the crystalline silicon film is used as the active layer of the TFT, it is also possible to use an amorphous silicon film as the active layer.

Note that it is effective to form the active layer of the switching TFT, in which there is a necessity to reduce the off current, by the amorphous silicon film, and to form the active layer of the current control TFT by the crystalline silicon film. Electric current flows with difficulty in the amorphous silicon film because the carrier mobility is low, and the off current does not easily flow. In other words, the most can be made of the advantages of both the amorphous silicon film, through which current does not flow easily, and the crystalline silicon film, through which current easily flows.

Next, as shown in FIG. 14B, a protective film 203 is formed on the crystalline silicon film 202 with a silicon oxide film having a thickness of 130 nm. This thickness may be chosen within the range of 100 to 200 nm (preferably between 130 and 170 nm). Furthermore, another films such as insulating films containing silicon may also be used. The protective film 203 is formed so that the crystalline silicon film is not directly exposed to plasma during addition of an impurity, and so that it is possible to have delicate concentration control of the impurity.

Resist masks 204a, 204b, and 204c are then formed on the protective film 203, and an impurity element, which imparts n-type conductivity (hereafter referred to as an n-type impurity element), is added through the protective film 203. Note that elements residing in periodic table group 15 are generally used as the n-type impurity element, and typically phosphorous or arsenic can be used. Note that a plasma doping method is used, in which phosphine ($PH_3$) is plasma-excited without separation of mass, and phosphorous is added at a concentration of $1\times10^{18}$ atoms/cm$^3$ in Embodiment 9. An ion implantation method, in which separation of mass is performed, may also be used, of course.

The dose amount is regulated such that the n-type impurity element is contained in n-type impurity regions (b) 205a, 205b thus formed by this process, at a concentration of $2\times10^{16}$ to $5\times10^{19}$ atoms/cm$^3$ (typically between $5\times10^{17}$ and $5\times10^{18}$ atom/cm$^3$).

Next, as shown in FIG. 14C, the protective film 203 and the resist masks 204a, 204b, and 204c are removed, and an activation of the added n-type impurity elements is performed. A known technique of activation may be used as the means of activation, but activation is done in Embodiment 9 by irradiation of excimer laser light (laser annealing). Of course, a pulse emission excimer laser and a continuous emission excimer laser may both, be used, and it is not necessary to place any limits on the use of excimer laser light. The goal is the activation of the added impurity element, and it is preferable that irradiation is performed at an energy level at which the crystalline silicon film does not melt. Note that the laser irradiation may also be performed with the protective film 203 in place.

The activation of impurity elements by heat treatment (furnace annealing) may also be performed along with activation of the impurity element by laser light When activation is performed by heat treatment, considering the heat resistance of the substrate, it is good to perform heat treatment at about 450 to 550° C.

A boundary portion (connecting portion) with end portions of the n-type impurity regions (b) 205a, 205b, namely regions, in which the n-type impurity element is not added, on the periphery of the n-type impurity regions (b) 205a, 205b, is delineated by this process. This means that, at the point when the TFTs are later completed, extremely good connecting portion can be formed between LDD regions and channel forming regions.

Unnecessary portions of the crystalline silicon film are removed next, as shown in FIG. 14D, and island-shape semiconductor films (hereinafter referred to as active layers) 206 to 210 are formed.

Then, as shown in FIG. 15A, a gate insulating film 211 is formed, covering the active layers 206 to 210. An insulating film containing silicon and with a thickness of 10 to 200 nm, preferably between 50 and 150 nm, may be used as the gate insulating film 211. A single layer structure or a lamination structure may be used. A 110 nm thick silicon oxinitride film is used in Embodiment 9.

Thereafter, a conductive film having a thickness of 200 to 400 nm is formed and patterned to form gate electrodes 212 to 216. In Embodiment 9, the gate electrodes and wirings (hereinafter referred to as gate wirings) electrically connected to the gate electrodes for providing conductive paths are formed of the same materials. Of course, the gate electrode and the gate wiring may be formed of different materials from each other. More specifically, the gate wirings are made of a material having a lower resistivity than the gate electrodes. This is because a material enabling fine processing is used for the gate electrodes, while the gate wirings are formed of a material that can provide a smaller wiring resistance but is not suitable for fine processing. The wiring resistance of the gate wiring can be made extremely small by using this type of structure, and therefore a pixel display region (pixel portion) having a large surface area can be formed. Namely, the above described pixel structure is extremely effective when an area sensor with a sensor portion having a screen size of a 10 inch diagonal or larger (in addition, a 30 inch or larger diagonal) is realized.

Although the gate electrode can be made of a single-layered conductive film, it is preferable to form a lamination film with two layers or three layers, if necessary. Any known conductive films can be used for the gate electrodes 212 to 216.

Typically, it is possible to use a film made of an element selected from the group consisting of aluminum (Al), tantalum (Ta), titanium (Ti), molybdenum (Mo), tungsten (W), chromium (Cr), and silicon (Si), a film of nitride of the above element (typically a tantalum nitride film, tungsten nitride film, or titanium nitride film), an alloy film of combination of the above elements (typically Mo—W alloy or Mo—Ta alloy), or a silicide film of the above element (typically a tungsten silicide film or titanium silicide film). Of course, the films may be used as a single layer or a laminate layer.

In Embodiment 9, a laminate film of a tungsten nitride (WN) film having a thickness of 30 nm and a tungsten (W) film having a thickness of 370 nm is used. This may be formed by sputtering. When an inert gas such as Xe or Ne is added as a sputtering gas, film peeling due to stress can be prevented.

The gate electrodes 213 and 216 are respectively formed at this time so as to overlap a portion of the n-type impurity regions (b) 205a and 205b through the gate insulating film 211. This overlapping portion later becomes an LDD region overlapping the gate electrode.

Next, an n-type impurity element (phosphorous is used in Embodiment 9) is added in a self-aligning manner with the gate electrodes 212 to 216 as masks, as shown in FIG. 15B. The addition is regulated such that phosphorous is added to n-type impurity regions (c) 217 to 224 thus formed at a concentration of $1/10$ to $1/2$ that of the n-type impurity regions (b) 205a and 205b (typically between $1/4$ and $1/3$). Specifically, a concentration of $1\times10^{16}$ to $5\times10^{18}$ atoms/cm$^3$ (typically $3\times10^{17}$ to $3\times10^{18}$ atoms/cm$^3$) is preferable.

Resist masks 225a to 225c are formed next, with a shape covering the gate electrodes 212, 214 and 215, as shown in FIG. 15C, and an n-type impurity element (phosphorous is used in Embodiment 9) is added, forming impurity regions (a) 226 to 233 containing phosphorous at high concentration. Ion doping using phosphine (PH$_3$) is also performed here, and the phosphorous concentration of these regions is regulated so as to be set to from $1\times10^{28}$ to $1\times10^{21}$ atoms/cm$^3$ (typically between $2\times10^{28}$ and $5\times10^{21}$ atoms/cm$^3$).

A source region or a drain region of the n-channel TFT is formed by this process, and in the n-channel TFT, a portion of the n-type impurity regions (c) 217, 218, 222, and 223 formed by the process of FIG. 15B is remained. These remaining regions correspond to LDD regions.

Next, as shown in FIG. 15D, the resist masks 225a to 225c are removed, and new resist masks 234a and 234b are formed. A p-type impurity element (boron is used in Embodiment 9) is then added, forming p-type impurity regions 235 and 236 containing boron at high concentration. Boron is added here at a concentration of $3\times10^{20}$ to $3\times10^{21}$ atoms cm$^3$ (typically between $5\times10^{20}$ and $1\times10^{21}$ atoms/cm$^3$) by ion doping using diborane (B$_2$H$_6$).

Note that phosphorous has already been added to the impurity regions 235 and 236 at a concentration of $1\times10^{20}$ to $1\times10^{21}$ atoms/cm$^3$, but boron is added here at a concentration of at least 3 times or more that of the phosphorous. Therefore, the n-type impurity regions already formed completely invert to p-type, and function as p-type impurity regions.

Next, after removing the resist masks 234a and 234b, the n-type or p-type impurity elements added to the active layer at respective concentrations are activated. Furnace annealing, laser annealing or lamp annealing can be used as a means of activation. In Embodiment 9, heat treatment is performed for 4 hours at 550° C. in a nitrogen atmosphere in an electric furnace.

At this time, it is important to eliminate oxygen from the surrounding atmosphere as much as possible. This is because an exposed surface of the gate electrode is oxidized, which results in an increased resistance if only a small amount of oxygen exists. Accordingly, the oxygen concentration in the surrounding atmosphere for the activation process is set at 1 ppm or less, preferably at 0.1 ppm or less.

A first interlayer insulating film 237 is formed next, as shown in FIG. 16A. A single layer insulating film containing silicon is used as the first interlayer insulating film 237, or a lamination film may be used. Further, a film thickness of between 400 nm and 1.5 μm may be used. A lamination structure of a silicon oxide film having a thickness of 800 nm on a silicon oxinitride film having a thickness of 200 nm thick is used in Embodiment 9.

In addition, heat treatment is performed for 1 to 12 hours at 300 to 450° C. in an atmosphere containing between 3 and 100% hydrogen, performing hydrogenation. This process is one of hydrogen termination of dangling bonds in the semiconductor film by hydrogen, which is thermally excited. Plasma hydrogenation (using hydrogen excited by plasma) may also be performed as another means of hydrogenation.

Note that the hydrogenation processing may also be inserted during the formation of the first interlayer insulating film 237. Namely, hydrogen processing may be performed as above after forming the 200 nm thick silicon oxinitride film, and then the remaining 800 nm thick silicon oxide film may be formed.

Next, a contact hole is formed in the gate insulating film 211 and the first interlayer insulating film 237, and source wirings 238 to 242 and drain wirings 243 to 247 are formed. In this embodiment, this electrode is made of a laminate film of three-layer structure in which a titanium film having a thickness of 100 nm, an aluminum film containing titanium and having a thickness of 300 nm, and a titanium film having a thickness of 150 nm are continuously formed by sputtering. Of course, other conductive films may be used.

A first passivation film 248 is formed next with a thickness of 50 to 500 nm (typically between 200 and 300 nm). A 300 nm thick silicon oxinitride film is used as the first passivation film 248 in Embodiment 9. This may also be substituted by a silicon nitride film. Note that it is effective to perform plasma processing using a gas containing hydrogen such as H$_2$ or NH$_3$ before the formation of the silicon oxinitride film. Hydrogen activated by this preprocess is supplied to the first interlayer insulating film 237, and the film quality of the first passivation film 248 is improved by performing heat treatment. At the same time, the hydrogen added to the first interlayer insulating film 237 diffuses to the lower side, and the active layers can be hydrogenated effectively.

Next, a second interlayer insulating film 249 made of organic resin is formed as shown in FIG. 16B. As the organic resin, it is possible to use polyimide, polyamide, acryl, BCB (benzocyclobutene) or the like. Especially, since the second interlayer insulating film 249 is primarily used for leveling, acryl excellent in leveling properties is preferable. In this embodiment, an acrylic film is formed to a thickness sufficient to level a stepped portion formed by TFTs. It is appropriate that the thickness is made 1 to 5 μm (more preferably, 2 to 4 μm).

Next, a contact hole is fanned in the second interlayer insulating film 249 and the first passivation film 248 so as to reach the drain wiring 245, and a cathode electrode 250 of a light receiving diode (photoelectric converting element) is formed so as to contact the drain wiring 245. In embodiment 9, an aluminum film formed by sputtering is used as the cathode electrode 250, but other metals, for example titanium, tantalum, tungsten, and copper can also be used. Further, a lamination film made from titanium, aluminum, and titanium may also be used.

Patterning is next performed after depositing an amorphous silicon film containing hydrogen over the entire surface of the substrate, and a photoelectric conversion layer 251 is formed. Then, a transparent conductive film is formed on the entire surface of the substrate. A 200 nm thick ITO film is deposited by sputtering as the transparent conductive film in Embodiment 9. The transparent conductive film is patterned, forming an anode electrode 252. (FIG. 16C.)

Figure 17A:
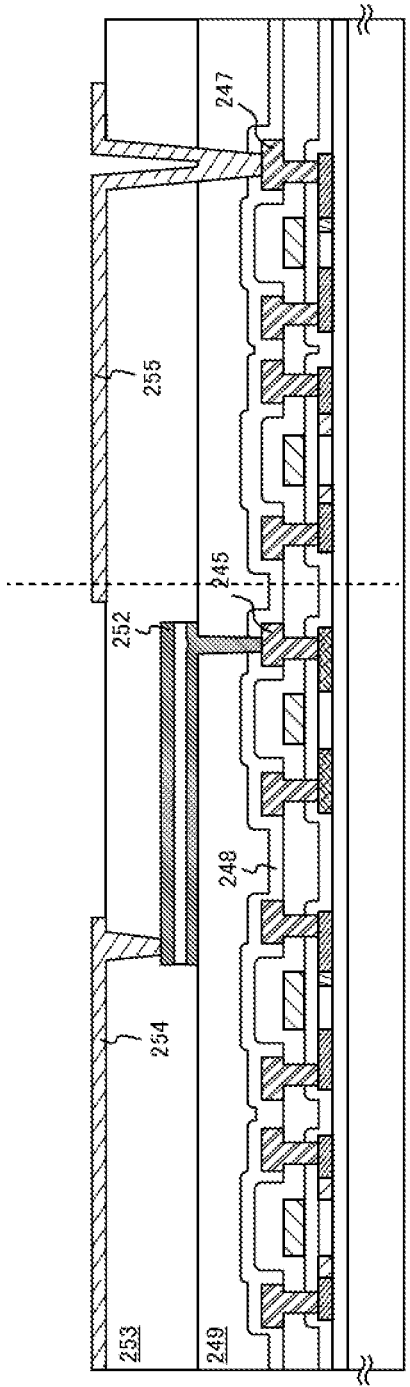
FIGS. 17A and 17B are diagrams of the process of manufacturing the sensor portion.

A third interlayer insulating film 253 is then formed, as shown in FIG. 17A. A level surface can be obtained by using a resin such as polyimide, polyimide, polyimide amide, or acrylic as the third interlayer insulating film 253. A polyimide film having a thickness of 0.7 μm is formed over the entire surface of the substrate as the third interlayer insulating film 253 in Embodiment 9.

Figure 17B:
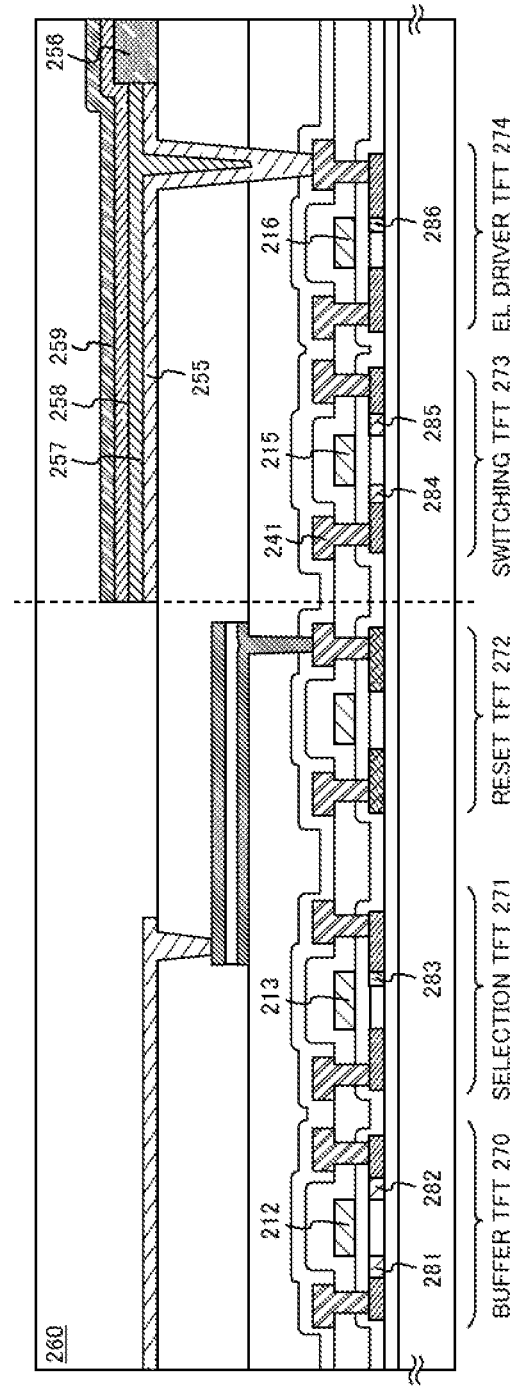

A contact hole is next formed in the third interlayer insulating film 253, the second interlayer insulating film 249, and the first passivation film 248 so as to reach the drain wiring 247, and a pixel electrode 255 is formed. Further, a contact hole for reaching the anode electrode 252 is formed in the third interlayer insulating film 253, and a sensor wiring 254 is formed. A 300 nm thick aluminum alloy film (an aluminum film comprising titanium of 1 wt %) is formed in Embodiment 9, and then patterning is performed, forming the sensor wiring 254 and the pixel electrode 255 at the same time. Then, as shown in FIG. 17B, a bank 256 made of a resin material is formed. The bank 256 may be formed by patterning an acrylic film or a polyimide film having a thickness of 1 to 2 μm. The bank 256 is formed having a stripe shape between pixels. The bank 256 may be formed along and on the source wiring 241, and it may also be formed along and on the gate wiring (not shown in drawing) Note that a material such as a pigment may be mixed into the resin material forming the bank 256, and the bank 256 may be used as a shielding film.

A light emitting layer 257 is next formed. Specifically, an organic EL material to form the light emitting layer 257 is dissolved in a solvent such as chloroform, dichloromethane, xylene, toluene, and tetrahydrofuran, and is then applied. Thereafter, heat treatment is performed to volatilize the solvent. In this way, a film (light emitting layer) made of the organic EL material is thus formed.

It is to be noted that only one pixel is illustrated in Embodiment 9. However, a light emitting layer luminescing red color, a light emitting layer luminescing green color, and a light emitting layer luminescing blue color are all formed at the same time at this point. In Embodiment 9, a cyano-paraphenylene vinylene is used for forming the light emitting layer luminescing red color, a paraphenylene vinylene for the light emitting layer luminescing green color, and a polyalkylphenylene for the light emitting layer luminescing blue color. Each of these light emitting layers is formed to a thickness of 50 nm. In addition, 1.2 dichloromethane is used as a solvent, and then volatilized by performing heat treatment on a hot plate at 80 to 150° C. for 1 to 5 minutes.

Next, a hole injection layer 258 is formed to a thickness of 20 nm. Since the hole injection layer 258 may be provided commonly for all the pixels, it is appropriate to form the hole injection layer by utilizing the spin coating method or the printing method. In Embodiment 9, polythiophene (PEDOT) is applied as a solution, and heat treatment is performed on a hot plate at 100 to 150° C. for 1 to 5 minutes to thereby volatilize its moisture. In this case, the hole injection layer 258 can be formed without dissolving the light emitting layer 257 because polyphenylene vinylene or polyalkylphenylene is insoluble.

It is possible to use a low molecular organic EL material as the hole injection layer 258. In this case, it is appropriate to form the hole injection layer by the evaporation method.

A two-layered structure made of the light emitting layer and the hole injection layer is formed in Embodiment 9. However, other layers such as a hole transporting layer, an electron injection layer, and an electron transporting layer may also be provided. Examples of various lamination structures of such combination of layers have been reported, and any structure may be used for the present invention.

After the formation of the light emitting layer 257 and the hole injection layer 258, an anode 259 made of a transparent conductive film is formed to a thickness of 120 nm as a counter electrode. In Embodiment 9, indium oxide doped with 10 to 20 wt % of zinc oxide, is used for the transparent conductive film. As the film deposition method, it is preferable to form the anode 259 by evaporation at room temperature so that the light emitting layer 257 and the hole injection layer 258 are not deteriorated.

After the formation of the anode 259, as shown in FIG. 17B, a fourth interlayer insulating film 260 is formed. A level surface can be obtained by using a resin such as polyimide, polyamide, polyimide amide, or acrylic as the fourth interlayer insulating film 260. A polyimide film having a thickness of 0.7 μm is formed over the entire surface of the substrate as the fourth interlayer insulating film 260 in Embodiment 9.

A sensor substrate having a structure as shown in FIG. 17B is thus completed. Note that after the formation of the bank 256, it is effective to use the multi-chamber method (or the in-line method) of the thin film deposition apparatus for the process of forming the films until the formation of the fourth interlayer insulating film 260, in succession and without exposure to the atmosphere.

Reference numeral 270 shows a buffer TFT 271 shows a selective. TFT, 272 shows reset TFT, 273 shows a switching TFT, and 274 shows EL driving TFT.

In embodiment 9, the buffer TFT 270 and the switching TFT 273 are an n-channel TFT, and both of source region side and drain region side have LDD regions 281 to 284. Note that the LDD regions 281 to 284 do not overlap with the gate electrodes 212 and 215 through the gate insulating film 211. The above constitution of the buffer TFT 270 and the switching TFT 273 can reduce the hot carrier injection as much as possible.

The formation of the LDD regions 283 and 286 on only the drain region side is in consideration of reducing the hot carrier injection and not causing the operating speed to drop. Further, it is not necessary to be too concerned with the value of the off current for the selection TFT 271 and EL driving TFT 274, and more importance may be placed on the operating speed. It is therefore preferable for the LDD regions 283 and 286 to completely overlap with the gate electrodes 213 and 216, and to reduce resistive components as much as possible. Namely, the so-called offset should be eliminated. In particular, when the source signal line driver circuit or the gate signal line driving circuit is driven at 15V to 20V, the above constitution of the EL driving TFT 274 of the embodiment 9 is effective to reduce the hot carrier injection and also not to drop the operation speed.

Furthermore, in embodiment 9, a reset TFT 272 is p-channel TFT and has no LDD region. Degradation due to hot carrier injection is almost of no concern for the p-channel TFTs, and therefore LDD regions do not have to be formed in particular. It is also possible, of course, to form an LDD region similar to that of an n-channel TFT to take action against hot carriers. Further, the reset TFT 272 may be an n-channel type TFT.

Note that in practice, after completing through FIG. 17B, it is preferable to perform packaging (sealing) using a protective film (such as a laminate film or an ultraviolet hardened resin film), or a light transmitting sealing member, having high airtight properties and little outgassing, in order to have no exposure to the atmosphere. The EL element reliability is increased if the inside of the sealing member is filled with an inert gas atmosphere and a drying agent (barium oxide, for example) is arranged within the sealing member.

Further, after increasing airtightness by the packaging process, the device is completed as a manufactured product by attaching a connector (flexible printed circuit, FPC) for connecting terminals pulled around from the elements or circuits formed on the substrate with external signal terminals. This shipping-ready state is referred to as an EL display (EL module) throughout this specification.

Note that the present invention is not limited to the manufacturing method mentioned above and it is possible to manufacture by the known method. Note that it is possible to combine this embodiment 9 with embodiments 1 to 4.

Embodiment 10

A method of manufacturing an area sensor used in the present invention is explained using FIGS. 18A to 21B.

Figure 18A:
FIGS. 18A to 18D are diagrams of a process of manufacturing a sensor portion.
Figure 18B:
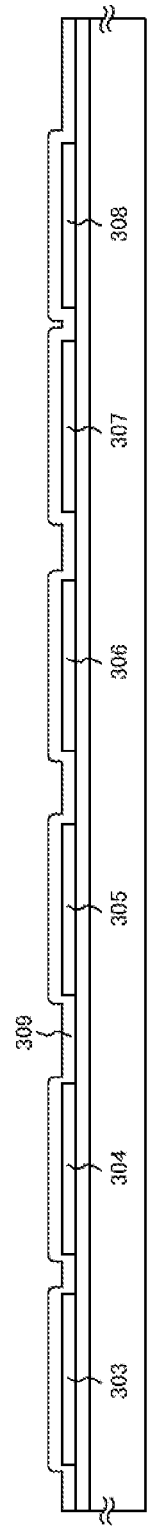
Figure 18C:
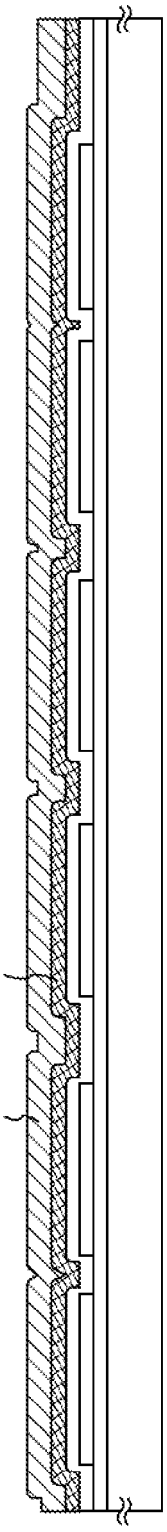

A non-alkaline glass substrate is used in a substrate 300 in FIG. 18A, typically, for example, a Corning Corp. 1737 glass substrate. A base film 301 is then formed by plasma CVD or sputtering on a surface of the substrate 300 on which TFTs will be formed. Although not shown in the figures the base film 301 is formed from a 25 to 100 nm (typically 50 nm) thick silicon nitride film and a 50 to 300 nm (typically 150 nm) thick silicon oxide film. Further, the base film 301 may also use only a silicon nitride film or only a silicon nitride oxide film.

Next, a 50 nm thick non-crystalline silicon film is formed on the base film 301 by plasma CVD. Although depending upon the amount of hydrogen contained in the non-crystalline silicon film, dehydrogenation is performed by heat treatment preferably for several hours between 400 and 550° C., and a crystallization process is preferably performed with the amount of contained hydrogen equal to or less than 5 atom %. Further, the non-crystalline silicon film may also be formed by another method of manufacture, such as sputtering or evaporation, but it is preferable that the amount of impurity element such as oxygen and nitrogen contained within the film be sufficiently reduced.

The base film and the non-crystalline silicon film are both manufactured by plasma CVD here, and the base film and the non-crystalline silicon film may also be formed in succession within a vacuum. By using a process in which there is no exposure to the atmosphere after forming the base film 301, it becomes possible to prevent surface contamination, and dispersion in the characteristics of the manufactured TFT can be reduced.

The non-crystalline silicon film is then crystallized by a known method, thereby forming a crystalline silicon film (also referred to as a polycrystalline silicon film and a polysilicon film) 302. (See FIG. 18A) A thermal crystallization method using an electric furnace, a laser anneal crystallization method using laser light, and a lamp anneal crystallization method using infrared light exist as known crystallization methods. Crystallization is performed in Embodiment 10 using excimer laser light from a XeCl gas.

Note that a pulse emission type excimer laser light processed into a linear shape is used in Embodiment 10, but a rectangular shape may also be used, and continuous emission type argon laser light and continuous emission type excimer laser light can also be used.

Further, the crystalline silicon film 302 is used as an active layer of a TFT in Embodiment 10, but it is also possible to use the non-crystalline silicon film as the active layer.

Note that it is effective to form the active layer of a switching TFT, in which it is necessary to reduce the off current, by the non-crystalline silicon film, and that it is effective to form the active layer of an EL driver TFT by the crystalline silicon film. The non-crystalline silicon film has a low carrier mobility, and therefore it becomes difficult for electric current to flow, and the off current does not flow easily. In other words, advantages of both the non-crystalline silicon film, in which it is difficult for electric current to flow, and the crystalline silicon film, in which electric current easily flows, can be given.

The crystalline silicon film 302 thus formed is patterned, forming island shape semiconductor layers (hereafter referred to as active layers) 303 to 308.

A gate insulating film 309 is formed next from a material having silicon oxide or silicon nitride as its main constituent, covering the active layers 303 to 308. The gate insulating film 309 may be formed from a silicon nitride oxide film having a thickness of 10 to 200 nm, preferably from 50 to 150 am, manufactured by plasma CVD with $N_2O$ and $SiH_4$ as raw materials. A 100 nm thickness is formed here. (See FIG. 18B)

A first conducting film 310 which becomes a first gate electrode, and a second conducting film 311 which becomes a second gate electrode, are then formed on the surface of the gate insulating film 309. The first conducting film 310 may be formed by a semiconductor film of one element selected from the group consisting of Si and Ge, or from a semiconductor film having one of the elements as its main constituent. Further, the thickness of the first conducting film 310 must be from 5 to 500 nm, preferably between 10 and 30 nm. A 20 nm thick Si film is formed here.

An impurity element which imparts n-type or p-type conductivity may be added to the semiconductor film used as the first conducting film 310. A known method may be followed for the method of manufacture of this semiconductor film. For example, it can be manufactured by reduced pressure CVD with a substrate temperature between 450 and 500° C. and disilane ($Si_2H_6$) introduced at 250 SCCM and helium (He) introduced at 300 SCCM. $PH_3$ may also be simultaneously mixed in to $Si_2H_6$ 0.1 to 2% at this time, forming an n-type semiconductor film.

The second conducting film 311 which becomes the second gate electrode may be formed from an element selected from the group consisting of Ti, Ta, W, and Mo, or from a compound having one of these elements as its main constituent. This is in consideration of lowering the electric resistance of the gate electrode, and an Mo—W compound may be used, for example. Ta is used here, and is formed by sputtering to a thickness of 200 to 1000 nm, typically 400 nm. (See FIG. 18C)

Figure 18D:
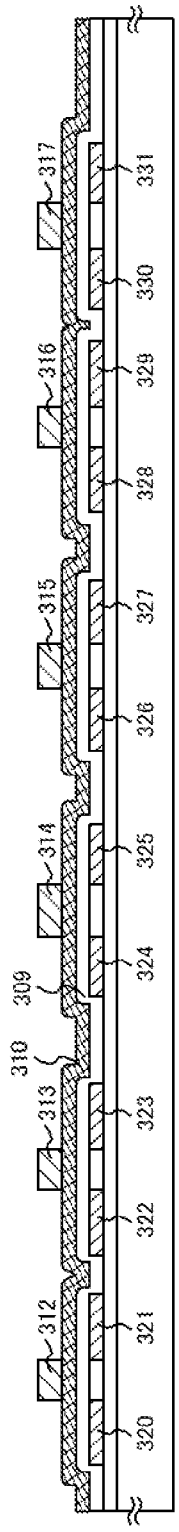

A resist mask is formed next using a known patterning technique, and a step of etching the second conducting film 311 and forming second gate electrodes 312 to 317 is performed. The second conducting film 311 is formed by a Ta film, and therefore dry etching is performed. Dry etching is performed with the following conditions: $Cl_2$ introduced at 80 SCCM, a pressure of 100 mTorr, and a high frequency electric power input of 500 W. The second gate electrodes 312 to 317 are thus formed as shown in FIG. 18D.

Even if a slight residue is confirmed after etching, it can be removed by washing with SPX cleaning liquid or a solution such as EKC.

Further, the second conducting film 311 can also be removed by wet etching. For example, it can easily be removed by a fluorine etching liquid when Ta is used.

A process of adding an n-type impurity element is performed next. This process is one for forming an LDD region, on doping is performed here using phosphine ($PH_3$). Phosphorous is added to through the gate insulating film 309 and the first conducting film 310 and into the active layers 303 to 308 by this process, and therefore the acceleration voltage is set rather high at 80 key. The concentration of phosphorous added to the active layers 303 to 308 is preferably in a range from $1\times10^{16}$ to $1\times10^{19}$ atoms/$cm^3$, and is set to $1\times10^{18}$ atoms/$cm^3$ here. Regions (n− regions) 320 to 331 of the active layers in which phosphorous is added at the above concentration are formed. (See FIG. 18D)

This phosphorous is also added to a region of the first conducting film 310 in which it does not overlap with the second gate electrodes 312 to 317. The phosphorous concentration of this region is not prescribed in particular, but an effect of lowering the resistivity of the first conducting layer 310 can be obtained.

Next, regions which form n-channel TFTs are covered by resist masks 332 and 334, and a process of removing a portion of the first conducting film 310 is performed. This is performed by dry etching here. The first conducting film 310 is Si, and therefore dry etching is performed with the following conditions: $CF_4$ introduced at 50 SCCM, $O_2$ introduced at 45 SCCM, a pressure of 50 mTorr, and a high frequency electric power input of 200 W. As a result, portions 336 and 338 of the first conducting film and the first gate electrodes 337 and 339 remain.

A process of adding a p-type impurity element into regions which form p-channel TFTs is then performed. The impurity element is added by ion doping using diborane ($B_2H_6$). The acceleration voltage is also set to 80 key here, and boron is added at a concentration of $2\times10^{20}$ atoms/$cm^3$. Impurity regions (p+ regions) 340 to 343 in which boron is added at high concentration are formed, as shown in FIG. 19A.

In addition, the resist masks 332 and 334 are completely removed, and new resist masks 348 to 353 are formed. Portion of the first conducting films 336 and 338 are then etched using the resist masks 348, 349, 351, and 352, and new portions 354, 355, and 357 of the first conducting film, and a first gate electrode 356, are formed.

A process of adding an n-type impurity element is then performed. Ion doping using phosphine ($PH_3$) is performed here. Phosphorous is added through the gate insulating film 309 and into the active layers below, and therefore a rather high acceleration voltage of 80 key is also set by this process. Regions (n+ regions) 358 to 365 to which phosphorous has been added are formed. The concentration of phosphorous in these regions is high when compared to the n− regions, and it is preferable that it be from $1\times10^{19}$ to $1\times10^{21}$ atoms/$cm^3$. The concentration is set to $1\times10^{20}$ atoms/$cm^3$ here. (See FIG. 19B) Regions of the n− regions 320, 321, 322, 323, 328 and 329 covered by the resist masks 348, 349, and 352 are determined as LDD regions by this process.

In addition, the resist masks 348 to 353 are removed, and new resist masks 366 to 371 are formed. The resist masks 366, 367, and 370 are formed with an aim of forming first gate electrodes from portions of the first conducting films 354, 355, and 357. LDD regions can be freely determined in a region which overlaps with the first gate electrode through the gate insulating film 309, and in a region which does not overlap, by the length of the resist masks. The length in the longitudinal direction of the channel of the resist masks 366, 367, and 370 for forming n-channel TFTs is very important in determining the structure of the channel forming regions of the TFTs (see FIG. 19C).

First gate electrodes 372, 373, 359, and 374 are formed, as shown in FIG. 20A.

The resist masks 366 to 371 are removed next, and a process forming an insulating film 375 and a first interlayer insulating film 376 is performed. The insulating film 375 is formed first from silicon nitride of a thickness of 50 nm. The insulating film 375 is formed by plasma CVD under the following conditions: $SiH_4$ introduced at 5 SCCM, $NH_3$ introduced at 40 SCCM, and $N_2$ introduced at 100 SCCM, a pressure of 0.7 Torr, and a high frequency electric power input of 300 W. Continuing, a silicon oxide film is then formed of a thickness of 950 nm under the following conditions: TEOS introduced at 500 SCCM, $O_2$ introduced at 50 SCCM, a pressure of 1 Torr, and a high frequency electric power input of 200 W.

A heat treatment process is then performed. It is necessary to perform the heat treatment process in order to activate the impurity elements which impart n-type of p-type conductivity and which have been added at various concentrations. Thermal annealing using an electric heating furnace, laser annealing using the above excimer laser, and rapid thermal annealing (RTA) using a halogen lamp may be used for the heat treatment process. The activation process is performed by thermal annealing here. The heat treatment process is performed at a temperature of 300 to 700° C., preferably between 350 and 550° C., at 450° C. here, in a nitrogen environment for 2 hours.

Contact holes are formed next in the first interlayer insulating film 376 and in the insulating film 375 in order to reach the source and drain regions of the respective TFTs, and source wirings 377 to 382 and drain wirings 383 to 388 are formed. Although not shown in the figures, a three layer structure in which a 100 nm thick Ti film, a 300 nm thick Al film containing Ti, and a 150 nm thick Ti film formed in succession by sputtering is used in Embodiment 10. (See FIG. 20B)

A passivation film 390 is formed next, covering the source wirings 377 to 382, the drain wirings 383 to 388, and the first interlayer insulating film 376. The passivation film 390 is formed by a silicon nitride film having a 50 nm thickness. In addition, a second interlayer insulating film 391 is formed from an organic resin having a thickness of about 1000 nm. Materials such as polyimide, acrylic, and polyimide amide can be used as the organic resin film. The following can be given as advantages of the organic resin film: the method of film formation is simple; its specific dielectric constant is low, and therefore the parasitic capacitance can be reduced; and it has superior leveling characteristics. Note that organic resin films other than those stated above can also be used. A heat polymerizing type polyimide is used here, and after application to the substrate, it is formed by firing at 300° C. (See FIG. 20C)

Contact holes for reaching the drain wirings 388 and 386 are formed next in the second interlayer insulating film 391 and in the passivation film 390, and a pixel electrode 392 and a sensor wiring 393 are formed. An indium oxide and tin oxide (ITO) film is formed with a 110 Mt thickness in. Embodiment 10, and then patterning is performed, forming the sensor wiring 393 and the pixel electrode 392 simultaneously. Further, a transparent conducting film in which between 2 and 20% of zinc oxide (ZnO) is mixed into indium oxide may also be used. The pixel electrode 392 becomes an anode of an EL element. (See FIG. 21A)

A bank 394 is formed next from a resin material. The bank 394 may be formed by patterning an acrylic film or a polyimide film having a thickness of 1 to 2 µm. The bank 394 is formed between pixels in a stripe shape. The bank 394 may be formed on and along the source wiring 381, and it may be formed on and along a gate wiring (not shown in the figures). Note that the bank 394 may also be used as a shielding film by mixing a pigment or the like into the resin material which forms the bank 394.

An EL layer 395 and a cathode (MgAg electrode) 396 are formed next in succession, without exposure to the atmosphere, using a vacuum evaporation method. Note that the film thickness of the EL layer 395 may be set from 80 to 200 nm (typically between 100 and 120 nm), and the thickness of the cathode 396 may be set from 180 to 300 nm (typically 200 to 250 nm). Note also that only one pixel is shown in the figures in Embodiment 10, but an EL layer which emits red color light, an EL layer which emits green color light, and an EL layer which emits blue color light are formed at the same time.

The EL layer 395 and the cathode 396 are formed one after another with respect to pixels corresponding to the color red, pixels corresponding to the color green, and pixels corresponding to the color blue. However, the EL layers 395 have weak resistance with respect to a solution, and therefore each of the colors must be formed separately without using a photolithography technique. It is preferable to cover areas outside of the desired pixels using a metal mask, and selectively form the EL layer 395 and the cathode 396 only in necessary locations.

In other words, a mask is first set so as to cover all pixels except for those corresponding to the color red, and the EL layer for emitting red color light and the cathode are selectively formed using the mask. Next, a mask is set so as to cover all pixels except for those corresponding to the color green, and the EL layer for emitting green color light and the cathode are selectively formed using the mask. Similarly, a mask is set so as to cover all pixels except for those corresponding to the color blue, and the EL layer for emitting blue color light and the cathode are selectively formed using the mask. Note that the use of all different masks is stated here, but the same mask may also be reused. Further, it is preferable to process without releasing the vacuum until the EL layers and the cathodes are formed for all of the pixels.

Note that the EL layer 395 is a single layer structure of a light emitting layer in Embodiment 10, but the EL layer may also have, in addition to the light emitting layer, layers such as a hole transporting layer, a hole injecting layer, an electron transporting layer, and an electron injecting layer. Various examples of these types of combinations have already been reported upon, and all of the structure may be used. A known material can be used as the EL layer 395. Considering the EL driver voltage, it is preferable to use a known material which is an organic material. Further, an example of using an MgAg electrode as the cathode of the EL element is shown in Embodiment 10, but it is also possible to use other known materials.

Figure 21A:
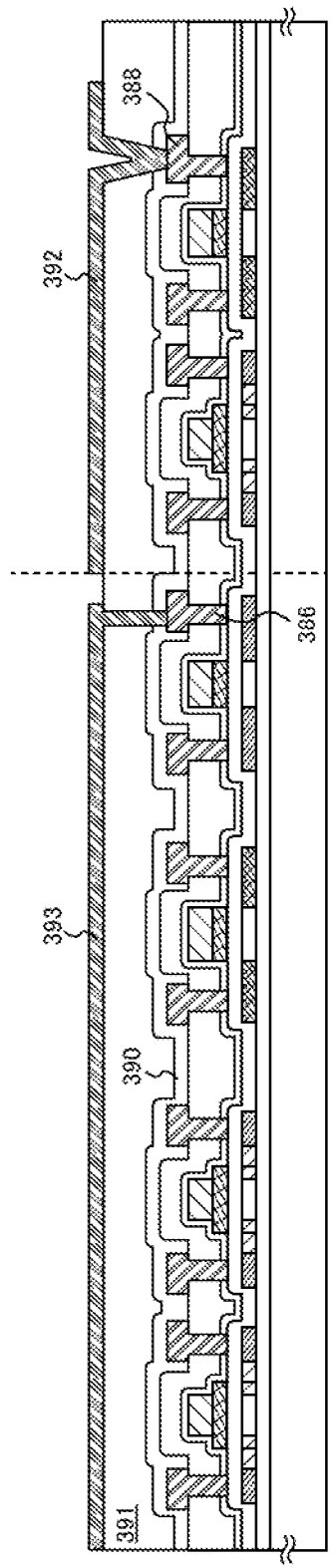
FIGS. 21A and 21B are diagrams of the process of manufacturing the sensor portion.
Figure 21B:
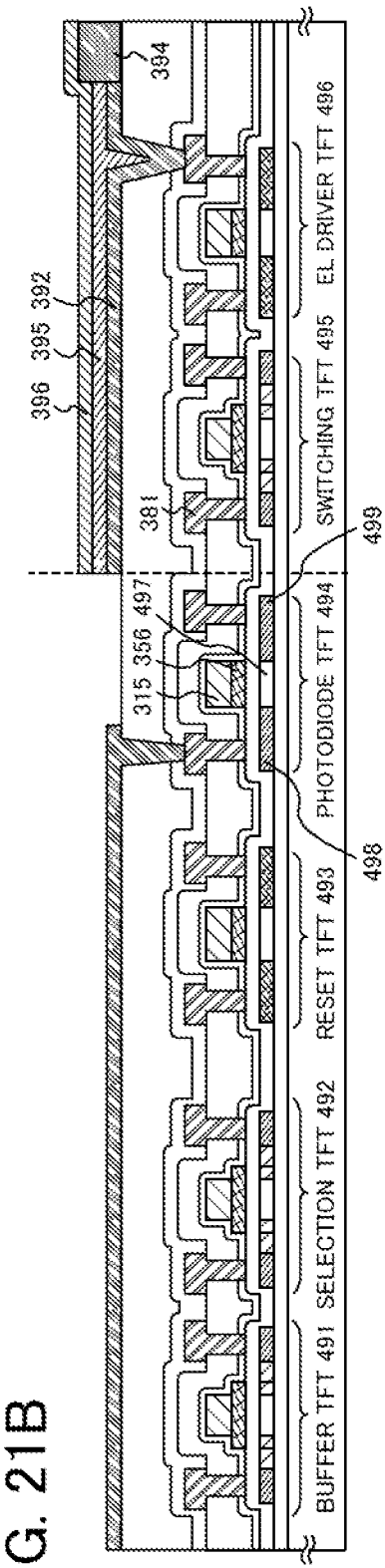

A sensor substrate having a structure as shown in FIG. 21B is thus completed. Note that it is effective to process from after forming the bank 394 up through the formation of the cathode 396 in succession, without exposure to the atmosphere, using a multi-chamber method (or an in-line method) thin film formation apparatus.

A method of manufacturing the TFTs of the sensor portion is explained in Embodiment 10, but TFTs of a driver portion may also be formed on the substrate at the same time by referring to the above processes.

Reference numeral 491 denotes a buffer TFT, reference numeral 492 denotes a selection TFT. 493 denotes a reset. TFT, 494 denotes a photodiode TFT, 495 denotes a switching TFT, and reference numeral 496 denotes an EL driver TFT.

A single gate structure is used for the switching TFT 495 in Embodiment 10, but a double gate structure may also be used, and a multi-gate structure possessing three or more gates may also be used. By making the switching TFT 495 a double gate structure, the structure effectively becomes two TFTs connected in series, which has the advantage of being able to reduce the amount of off current.

Note that the first gate electrode 356 and the second gate electrode 315 formed on the photodiode 494 are maintained at an electric potential at which an electric current does not flow in a photoelectric conversion layer 497 formed between an anode electrode 498 and a cathode electrode 499 when light is not irradiated to the photodiode 494 in Embodiment 10.

Further, the LDD regions formed in all of the TFTs do not overlap with the gate electrode in Embodiment 10. When a source signal line driver circuit or a gate signal line driver circuit is driven at 10 V or less, it is not necessary to worry very much about hot carrier injection, and therefore the structure of the TFTs of Embodiment 10 are effective.

Note that, in practice, after completing through FIG. 21B, it is preferable to perform packaging (sealing), without exposure to the atmosphere, using a protecting film (such as a laminated film and an ultraviolet hardened resin film) having good airtight characteristics and little outgassing, and a transparent sealing material. The reliability of the EL element is increased when doing so by making an inert atmosphere on the inside of the sealing material and by arranging a drying agent (for example, barium oxide) inside the sealing material.

Furthermore, after the airtight characteristics have been increased in accordance with the packaging process or the like, a connector (flexible printed circuit, FPC) is attached in order to connect terminals drawn from the elements and circuits formed on the substrate with external signal terminals. And the finished product is complete. This state at which the product is ready for delivery is referred to as an area sensor throughout this specification.

Note that the present invention is not limited to the above stated method of manufacture, and it is possible to manufacture using known methods. Further, it is possible to freely combine Embodiment 10 with any of Embodiments 1 to 4.

Embodiment 11

Figure 22A:
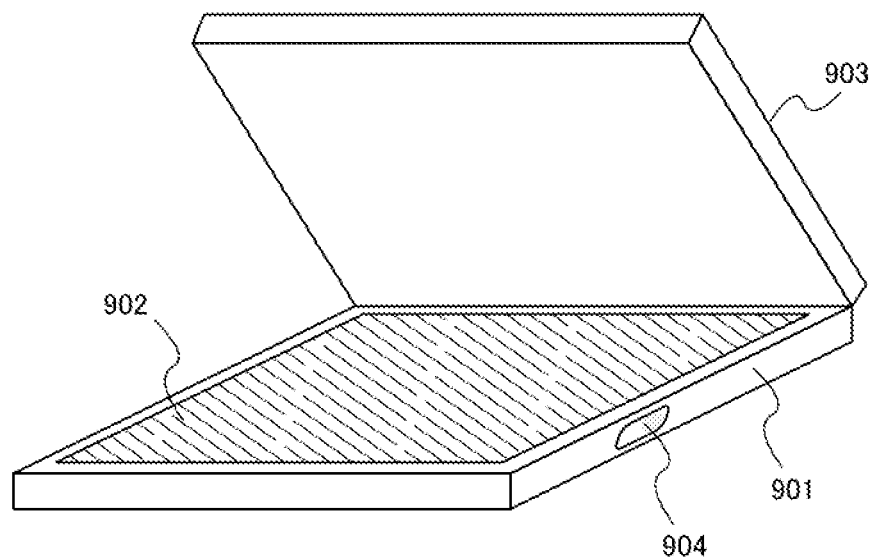
FIGS. 22A and 22B are perspective views of one example of an area sensor of the present invention, a portable hand scanner.
Figure 22B:
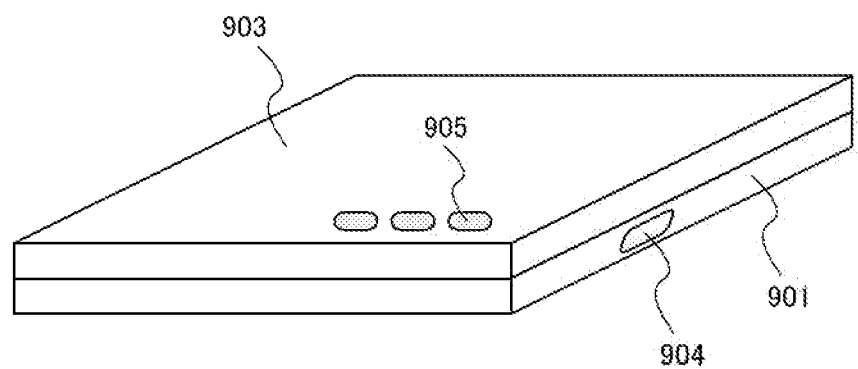

A portable hand scanner is explained as one example of an area sensor of the present invention using FIGS. 22A and 22B.

FIG. 22A is a portable hand scanner, and is composed of a main body 901, a sensor portion 902, a top cover 903, an external connection port 904, and operation switches 905. FIG. 22B is a diagram of the same portable hand scanner as in FIG. 22A, but with the top cover 903 closed.

It is possible to use the area sensor of the present invention for displaying an input image in the sensor portion 902, and without forming a new electronic display in the area sensor, the read-in image can be verified on the spot.

Further, the image signal read in by the area sensor 902 can be sent from the external connection port 904 to the outside of the portable hand scanner, and it becomes possible to perform operations such as image correction, synthesis, and editing by using software.

Note that it is possible to freely combine Embodiment 11 with any of Embodiments 1 to 10.

Embodiment 12

Figure 23:
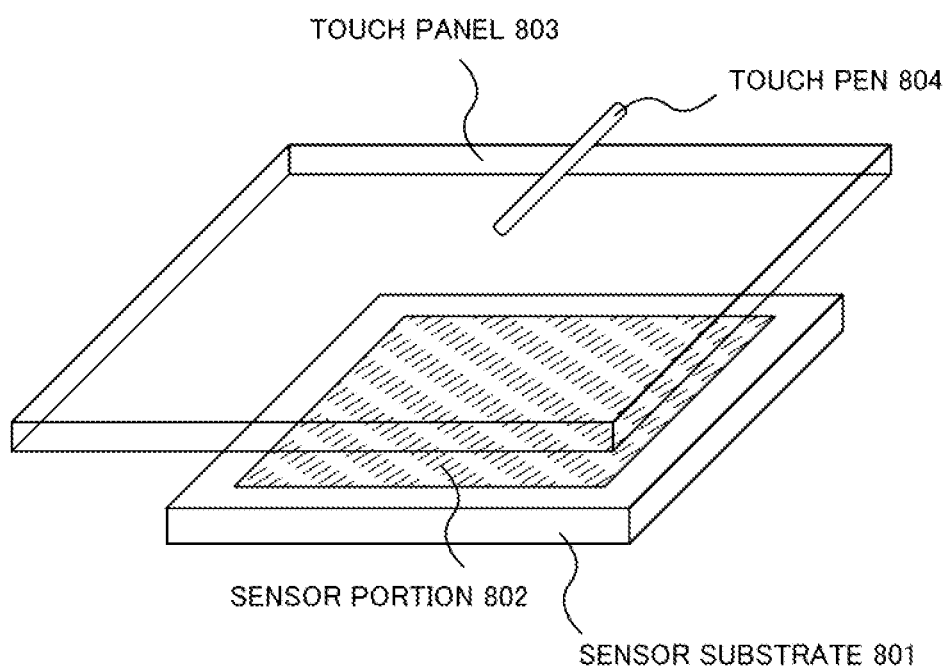
FIG. 23 is a perspective view of one example of an area sensor of the present invention, an area sensor with an attached touch panel.
Figure 24A:
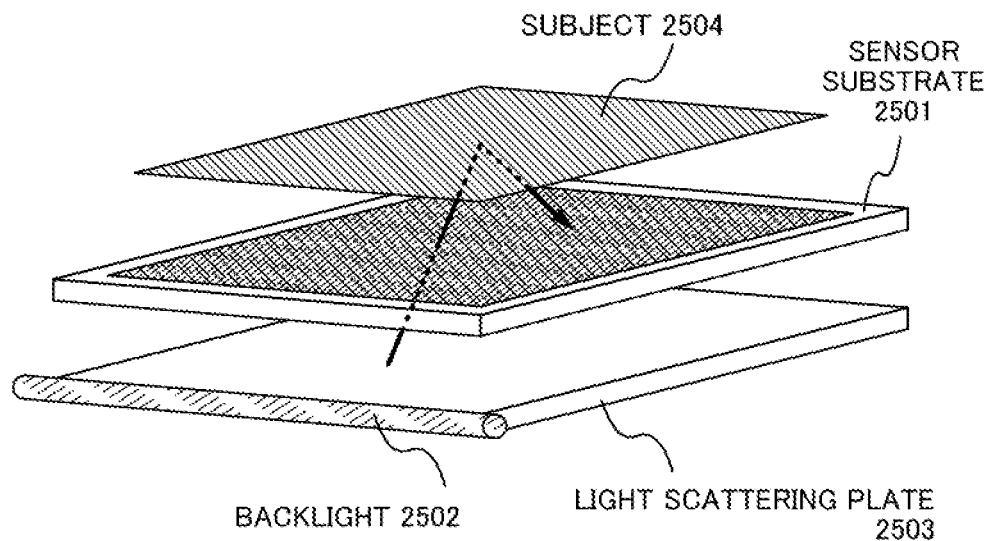
FIGS. 24A and 24B are a perspective view and a cross sectional diagram, respectively, of a conventional area sensor.
Figure 24B:
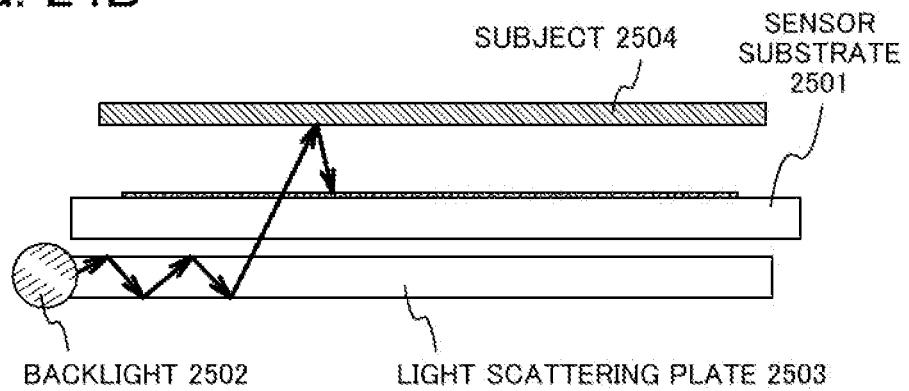

A portable hand scanner differing from that of Embodiment 11 is explained as one example of an area sensor of the present invention using FIG. 23.

Reference numeral 801 denotes a sensor substrate, reference numeral 802 denotes a sensor portion, reference numeral 803 denotes a touch panel, and reference numeral 804 denotes a touch pen. The touch panel 803 has light transmitting characteristics, and light emitted from the sensor portion 802 and light irradiated to the sensor portion 802 can pass through the touch panel 803. An image of a subject can be read in through the touch panel 803. Further, it is possible to see an image on the sensor portion 802, through the touch panel 803, when the image is displayed in the sensor portion 802.

When the touch pen 804 touches the touch panel 803, information on the position of the portion at which the touch pen 804 contacts the touch panel 803 can be taken in by the area sensor as an electronic signal. Regarding the touch panel 803 and the touch pen 804 used in Embodiment 12, provided that the touch panel 803 has light transmitting characteristics, and information on the position of the portion at which the touch pen 804 contacts the touch panel 803 can be taken in by the area sensor as an electronic signal, known touch panels and touch pens can be used.

The area sensor of the present invention having the above structure reads in an image and displays the image read into the sensor portion 602 and writing into the read in image can be performed by the touch pen 804. The area sensor of the present invention can perform reading in of the image, display of the image, and writing into the image, all in the sensor portion 802. Therefore the size of the area sensor itself can be suppressed, and the area sensor can be made to possess many types of functions.

Note that it is possible to freely combine Embodiment 12 with any of Embodiments 1 to 10.

Embodiment 13

An example of a structure of a sensor portion of an area sensor which differs from that of FIG. 1 is explained in Embodiment 13.

Figure 25:
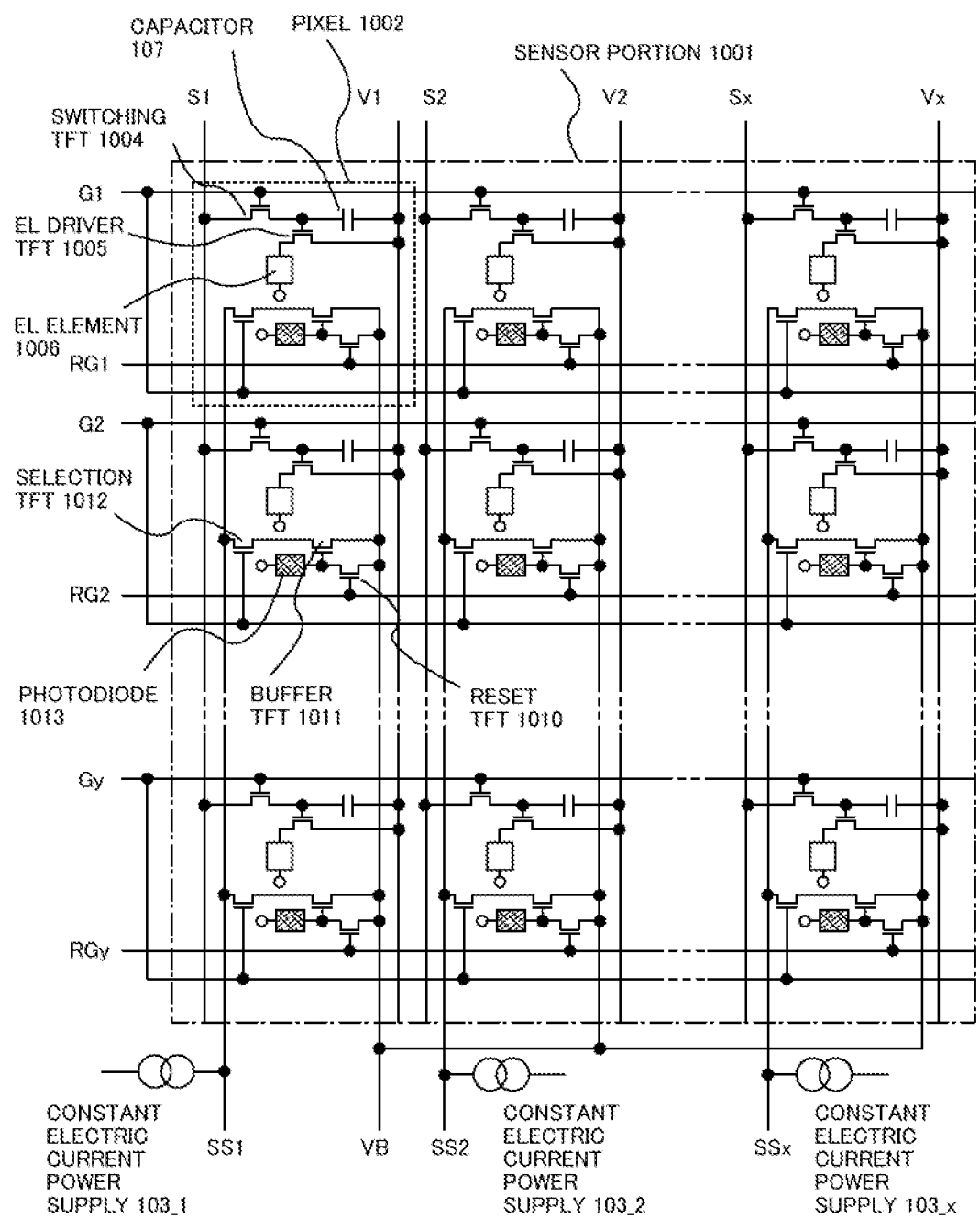
FIG. 25 is a circuit diagram of a sensor portion.

A circuit diagram of the sensor portion of the area sensor of Embodiment 13 is shown in FIG. 25. Source signal lines S1 to Sx, electric power source supply lines V1 to Vx, gate signal lines G1 to Gy, reset gate signal lines RG1 to RGy, sensor output wirings SS1 to SSx, and a sensor electric power source line VB are formed in a sensor portion 1001.

The sensor portion 1001 has a plurality of pixels 1002. The pixels 1002 have one of the source signal lines S1 to Sx, one of the electric power source supply lines V1 to Vx, one of the gate signal lines G1 to Gy, one of the reset gate signal lines RG1 to RGy, one of the sensor output wirings SS1 to SSx, and the sensor electric power source line VB.

The sensor output wirings SS1 to SSx are connected to constant electric current power supplies 1003_1 to 1003_x, respectively.

The pixel 1002 has a switching TFT 1004, an EL driver TFT 1005, and an EL element 1006. Further, in FIG. 25 a capacitor 1007 is formed in the pixel 1002, but the capacitor 1007 need not be formed. In addition, the pixel 1002 has a reset TFT 1010, a buffer TFT 1011, a selection TFT 1012, and a photodiode 1013.

The EL element 1006 is composed of an anode, a cathode, and an EL layer formed between the anode and the cathode. When the anode is connected to a source region or a drain region of the EL driver TFT 1005, the anode becomes a pixel electrode and the cathode becomes an opposing electrode. Conversely, when the cathode is connected to a source region or a drain region of the EL driver TFT 1005, the anode becomes the opposing electrode and the cathode becomes the pixel electrode.

A gate electrode of the switching TFT 1004 is connected to the gate signal lines G1 to Gy. One of a source region and a drain region of the switching TFT 1004 is connected to the source signal line S, and the other is connected to a gate electrode of the EL driver TFT 1005.

One of a source region and a drain region of the EL driver TFT 1005 is connected to the electric power source supply lines V1 to Vx, and the other is connected to the EL element 1006. The capacitor 1007 is formed connected to the gate electrode of the EL driver TFT 1005 and to the electric power source supply lines V1 to Vx.

A gate electrode of the reset TFT 1010 is connected to the reset gate signal lines RG1 to RGx. A source region of the reset TFT 1010 is connected to the sensor electric power source line VB, and the sensor electric power source line VB is always maintained at a constant electric potential (standard electric potential). Further, a drain region of the reset TFT 1010 is connected to the photodiode 1013 and to a gate electrode of the buffer TFT 1011.

Although not shown in the figure, the photodiode 1013 has a cathode electrode, an anode electrode, and a photoelectric conversion layer formed between the cathode electrode and the anode electrode. The drain region of the reset TFT 1010 is connected specifically to an the anode electrode or the cathode electrode of the photodiode 1013.

A drain region of the buffer TFT 1011 is connected to the sensor electric power source line VB, and is always maintained at the standard electric potential. A source region of the buffer TFT 1011 is connected to a source region or a drain region the selection TFT 1012.

A gate electrode of the selection TFT 1012 is connected to the gate signal lines G1 to Gx. One of a source region and a drain region of the selection TFT 1012 is connected to the source region of the buffer TFT 1011, as stated above, and the other is connected to the sensor output wirings SS1 to SSx. The sensor output wirings SS1 to SSx are connected to a constant electric current power supply 1003 (the constant electric current power supplies 1003_1 to 1003_x), and a constant electric always flows.

The polarity of the switching TFT 1004 and the selection TFT 1012 is the same in Embodiment 13. Namely, the selection TFT 1012 is an n-channel TFT when the switching TFT 1004 is an n-channel TFT, and the selection TFT 1012 is a p-channel TFT when the switching TFT 1004 is a p-channel TFT.

The gate electrode of the switching TFT 1004 and the gate electrode of the switching TFT 1012 are both connected to the gate signal lines G1 to Gx with the sensor portion of the area sensor of Embodiment 13, differing from the area sensor shown in FIG. 1. A period during which the EL elements 1006 of each pixel emit light is therefore the same length as the sampling periods ST1 to STn for the case of the area sensor of Embodiment 13. In accordance with the above structure, the number of wirings can be made less than for the case of FIG. 1 with the area sensor of Embodiment 13.

Note that it is also possible to display an image in the sensor portion 1001 with the area sensor of Embodiment 13.

It is possible to freely combine the constitution of Embodiment 13 with any of Embodiments 3 to 12.

Embodiment 14

A detailed structure of the sensor source signal line driver circuit 121 and the sensor gate signal line driver circuit 123 shown in FIG. 5 is explained in Embodiment 14.

Figure 26A:
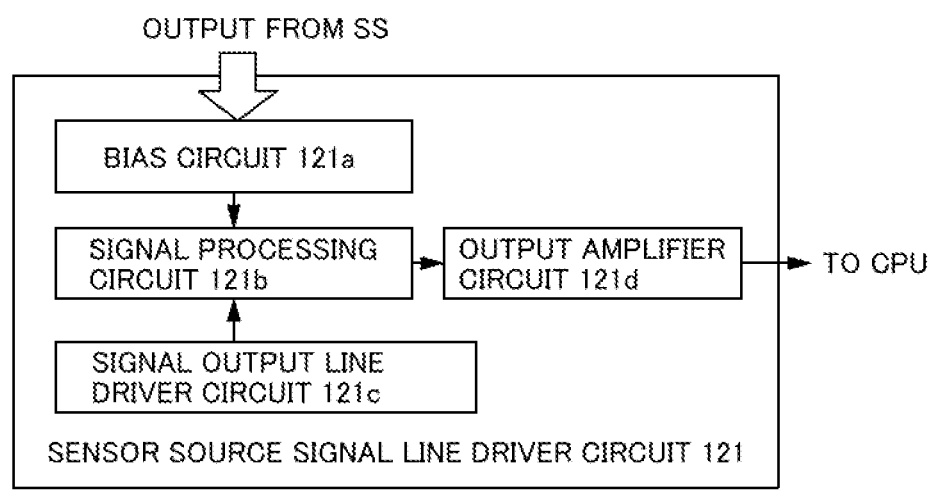
FIGS. 26A and 26B are circuit diagrams of a source signal line driver circuit and a gate signal line driver circuit, respectively, of a sensor portion.

A structure of the sensor source signal line driver circuit 121 is shown in FIG. 26A. The sensor source signal line driver circuit 121 has a bias circuit 121a, a signal processing circuit 121b, and a signal output line driver circuit 121c.

The bias circuit 121a has a constant electric current power supply, and paired with the buffer TFTs 111 of each pixel, this forms a source follower circuit. A signal input to each of the sensor output wirings SS is sampled, and input to the downstream signal processing circuit 121b.

Circuits such as those for storing once and maintaining the input signal, performing analog/digital conversion, and reducing noise are arranged in the signal processing circuit 121b. The signals processed in the signal processing circuit 121b are output in order to an output amplifier circuit 121d in accordance with a signal output from the signal output line driver circuit 121c.

The output amplifier circuit 121d amplifies the signal output from the signal processing circuit 121b. The output amplifier circuit 121d is not necessary for a case in which the signal is not amplified, but is often included at present.

The signal output from the output amplifier circuit 121d is taken in by components such as a CPU (not shown in the figures).

Figure 26B:
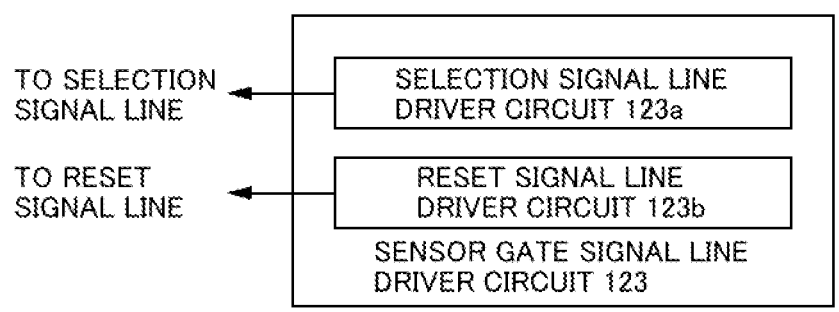

FIG. 26B shows a structure of the sensor gate signal line driver circuit 123. The sensor gate signal line driver circuit 123 has a selection signal line driver circuit 123a and a reset signal line driver circuit 123b.

The selection signal line driver circuit 123a inputs, in order to each selection signal line, a signal such that each of the selection TFTs 112 having their gate electrode connected to the selection signal line will turn on. Further, the reset signal line driver circuit 123b inputs, in order to each reset gate signal line, a signal such that each of the reset TFTs 110 having their gate electrode connected to the reset gate signal line will turn on.

Note that the sensor source signal line driver circuit 121 and the sensor gate signal line driver circuit 123 shown in FIG. 5 are explained in Embodiment 14, but the sensor source signal line driver circuit 131 and the sensor gate signal line driver circuit 133 shown in FIG. 8 may also have the structure shown by Embodiment 14.

It is possible to implement Embodiment 14 by freely combining with any of Embodiments 1 to 13.

Irregularities in the brightness of a read in image do not develop because light is uniformly irradiated to a subject in accordance with the above structure of the present invention. It is not necessary to form a back light and a light scattering plate separately from a sensor substrate, and therefore it is not necessary to precisely regulate the position of the back light, the light scattering plate, the sensor substrate, and the subject, differing from a conventional example. The mechanical strength of the area sensor itself also increases. Furthermore, a smaller, thinner, and lighter weight area sensor can be realized.

It is possible to display an image in a sensor portion using EL elements with the area sensor of the present invention. Therefore, it is possible to display an image, read in by the sensor portion, in the sensor portion without forming a new electronic display in the area sensor, and verification of the read in image can be performed on the spot.

What is claimed is:

1. A semiconductor device comprising a pixel, the pixel comprising:
    a first thin film transistor comprising a semiconductor layer, with a first insulating film over the semiconductor layer, and a gate over the semiconductor layer with the first insulating film therebetween;
    a photodiode comprising a photoelectric conversion layer;
    a sensor output wiring and a sensor electric power source line; and
    a second insulating film over the gate of the first thin film transistor;
    wherein the first insulating film is disposed over the photoelectric conversion layer,
    wherein the pixel is configured to irradiate the photoelectric conversion layer with light reflected by a subject,
    wherein a first terminal of the first thin film transistor is electrically connected to the sensor output wiring,
    wherein a second terminal of the first thin film transistor is electrically connected to the sensor electric power source line,
    wherein the gate of the first thin film transistor is electrically connected to a first terminal of the photodiode,
    wherein the semiconductor layer and the photoelectric conversion layer are on a same surface, and
    wherein the second insulating film is in contact with the first insulating film over the photoelectric conversion layer.

2. The semiconductor device according to claim 1, wherein the light is emitted from a light emitting layer and reflected by the subject.

3. The semiconductor device according to claim 1, wherein each of the semiconductor layer and the photoelectric conversion layer comprises crystalline silicon.

4. The semiconductor device according to claim 1, wherein the semiconductor layer and the photoelectric conversion layer are formed over a glass substrate.

5. A semiconductor device comprising a pixel, the pixel comprising:
    a first thin film transistor comprising a first semiconductor layer, with a first insulating film over the first semiconductor layer, and a gate over the first semiconductor layer with the first insulating film therebetween;
    a photodiode comprising a photoelectric conversion layer;
    a sensor output wiring and a sensor electric power source line;
    a second insulating film over the gate of the first thin film transistor;
    a second thin film transistor comprising a second semiconductor layer; and
    a pixel electrode electrically connected to the second thin film transistor,
    wherein the first insulating film is disposed over the photoelectric conversion layer,
    wherein the pixel is configured to irradiate the photoelectric conversion layer with light reflected by a subject,
    wherein a first terminal of the first thin film transistor is electrically connected to the sensor output wiring,
    wherein a second terminal of the first thin film transistor is electrically connected to the sensor electric power source line,
    wherein the gate of the first thin film transistor is electrically connected to a first terminal of the photodiode,
    wherein the first semiconductor layer, the second semiconductor layer and the photoelectric conversion layer are on a same surface, and
    wherein the second insulating film is in contact with the first insulating film over the photoelectric conversion layer.

6. The semiconductor device according to claim 5, wherein the semiconductor device is a light emitting display device.

7. The semiconductor device according to claim 5, further comprising a light emitting layer electrically connected to the pixel electrode.

8. The semiconductor device according to claim 7, wherein the light is emitted from the light emitting layer.

9. The semiconductor device according to claim 5, wherein each of the first semiconductor layer, the second semiconductor layer, and the photoelectric conversion layer comprises crystalline silicon.

10. The semiconductor device according to claim 5, wherein the first semiconductor layer, the second semiconductor layer, and the photoelectric conversion layer are formed over a glass substrate.

11. A semiconductor device comprising a pixel, the pixel comprising:
- a first thin film transistor comprising a semiconductor layer, with a first insulating film over the semiconductor layer, and a gate over the semiconductor layer with the first insulating film therebetween;
- a photodiode comprising a photoelectric conversion layer, with the first insulating film over the photoelectric conversion layer, and a gate over the photoelectric conversion layer with the first insulating film therebetween;
- a sensor output wiring and a sensor electric power source line; and
- a second insulating film over the gate of the first thin film transistor and the gate of the photodiode;

wherein the pixel is configured to irradiate the photoelectric conversion layer with light reflected by a subject, wherein a first terminal of the first thin film transistor is electrically connected to the sensor output wiring, wherein a second terminal of the first thin film transistor is electrically connected to the sensor electric power source line, wherein the gate of the first thin film transistor is electrically connected to a first terminal of the photodiode, and wherein the semiconductor layer and the photoelectric conversion layer are on a same surface.

12. The semiconductor device according to claim 11, wherein the semiconductor device is a light emitting display device.

13. The semiconductor device according to claim 11, wherein each of the semiconductor layer and the photoelectric conversion layer comprises crystalline silicon.

14. The semiconductor device according to claim 11, wherein the semiconductor layer and the photoelectric conversion layer are formed over a glass substrate.

15. The semiconductor device according to claim 11, further comprising a pixel electrode and a light emitting layer electrically connected to the pixel electrode.

16. The semiconductor device according to claim 15, wherein the light is emitted from the light emitting layer.

* * * * *